(12) United States Patent
Higashi

(10) Patent No.: US 7,126,843 B2
(45) Date of Patent: Oct. 24, 2006

(54) SEMICONDUCTOR MEMORY DEVICE USING MAGNETORESISTIVE EFFECT

(75) Inventor: Tomoki Higashi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/214,568

(22) Filed: Aug. 9, 2002

(65) Prior Publication Data

US 2003/0156450 A1 Aug. 21, 2003

(30) Foreign Application Priority Data

Feb. 15, 2002 (JP) .............................. 2002-039086

(51) Int. Cl.
*G11C 11/00* (2006.01)
(52) U.S. Cl. ..................... 365/158; 365/171; 365/173; 365/66; 365/230.03; 365/230.06; 365/196
(58) Field of Classification Search ................ 365/173, 365/171, 158, 66, 196, 230.06, 230.03
See application file for complete search history.

(56) References Cited

U.S. PATENT DOCUMENTS

| 5,748,554 | A | * | 5/1998 | Barth et al. ............ 365/230.03 |
| 5,852,574 | A | | 12/1998 | Naji |
| 6,185,132 | B1 | * | 2/2001 | Jung ...................... 365/185.21 |
| 6,226,208 | B1 | * | 5/2001 | Nakai et al. ................ 365/191 |
| 6,246,622 | B1 | * | 6/2001 | Sugibayashi ................ 365/210 |
| 6,272,041 | B1 | | 8/2001 | Naji |
| RE37,409 | E | * | 10/2001 | Barth et al. ............ 365/230.03 |
| 6,331,943 | B1 | | 12/2001 | Naji et al. |
| 6,485,989 | B1 | * | 11/2002 | Signorini ........................ 438/3 |
| 6,898,134 | B1 | * | 5/2005 | Smith et al. ................ 365/201 |
| 2003/0156450 | A1 | * | 8/2003 | Higashi ...................... 365/173 |

FOREIGN PATENT DOCUMENTS

| JP | 2000-20634 | 1/2000 |
| JP | 2000-163950 | 6/2000 |
| JP | 2003-77267 | 3/2003 |
| JP | 2003-257175 | 9/2003 |
| JP | 2002-170379 | 6/2006 |
| WO | WO 99/14760 | 3/1999 |
| WO | WO 99/18578 | 4/1999 |
| WO | WO 00/60600 | 10/2000 |

OTHER PUBLICATIONS

U.S. Appl. No. 10/214,568, filed Aug. 9, 2002, Higashi.
U.S. Appl. No. 10/369,886, filed Feb. 21, 2003, Iwata et al.

* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A semiconductor memory device includes memory cell arrays, word lines, sub-sense lines, main sense line, row decoders, column decoders, first switch elements, read circuit, and write circuit. Each memory cell array has a matrix of memory cells including magnetoresistive elements. Each magnetoresistive element has first and second magnetic layers and a first insulating layer formed between the first and second magnetic layers. The word line is connected to the first magnetic layers on each row. The sub-sense line is connected to the second magnetic layers on each column. The main sense line is connected to each sub-sense line. The row decoder and column decoder select a word line and sub-sense line. The first switch element connects the sub-sense line selected by the column decoder to the main sense line. The read circuit reads out data from a memory cell. The write circuit writes data in a memory cell.

42 Claims, 12 Drawing Sheets

SEMICONDUCTOR MEMORY DEVICE USING MAGNETORESISTIVE EFFECT

CROSS-REFERENCE TO RELATED APPLICATIONS

This application is based upon and claims the benefit of priority from the prior Japanese Patent Application No. 2002-039086, filed Feb. 15, 2002, the entire contents of which are incorporated herein by reference.

BACKGROUND OF THE INVENTION

1. Field of the Invention

The present invention relates to a semiconductor memory device and, more particularly, to the cell array structure of an MRAM (Magnetoresistive Random Access Memory).

2. Description of the Related Art

An MRAM is a device which performs memory operations by storing "1"- or "0"-information using the magnetoresistive effect, and is expected as a rewritable memory device which exhibits nonvolatility, high integration, high reliability, and high-speed operation as compared with conventional DRAMs, EEPROMs, and the like.

As an MRAM cell, the use of a GRM (Giant MagnetoResistive) element using a multilayer metal magnetic film/insulating film and a change in magnetoresistance due to a spin-polarized tunnel effect or a TMR (Tunneling MagnetoResistive) element has been proposed. A TMR element has an insulating film sandwiched between two magnetic films. This structure can create two states, i.e., a state where the directions of the spins of the two magnetic films are parallel to each other, and a state where the directions of the spins are antiparallel to each other. When the directions of spins become parallel to each other, the tunnel current flowing through the thin insulating film interposed between the two magnetic films increases, and the resistance value of the TMR element decreases. In contrast to this, if the directions of spins become antiparallel to each other, the tunnel current decreases, and the resistance value of the TMR element increases. "0"-data and "1"-data can be discriminated from each other in accordance with the magnitude of this resistance value.

The structure of an MRAM using the above TMR element as a memory cell is disclosed in Jpn. Pat. Appln. KOKAI Publication No. 2000-163950. FIG. 1A shows the arrangement of the MRAM disclosed in this reference.

As shown in FIG. 1A, in the MRAM cell array, (m×4) MRAM cells MC11 to MCm4 are arranged in the form of a matrix at the intersections of a plurality of word lines WL1 to WLm (m: integer) and sense lines SL1 to SL4 perpendicular to the word lines WL1 to WLm. One of the magnetic films of each of the MRAM cells MC11 to MCm4 is connected to one of the word lines WL1 to WLm, and the other magnetic film is connected to one of the sense lines SL1 to SL4. One end of each of the sense lines SL1 to SL4 is connected to ground potential via a corresponding one of ground switches S401 to S404, the other end of each sense line is connected to a corresponding one of read/write sections 100-1 to 100-4.

Each of the read/write sections 100-1 to 100-4 includes a write switch S500, read switch S600, write current source 110, and sense circuit 120. The write current source 110 and sense circuit 120 are connected to the respective sense lines SL1 to SL4 via the write switch S500 and read switch S600. The sense circuit 120 has an operational amplifier 130 and a current/voltage converter (resistive element) 140. The operational amplifier 130 has a noninverting input terminal connected to ground potential, an inverting input terminal connected to one of the sense lines SL1 to SL4 via the read switch S600, and an output terminal. The resistive element 140 has one end connected to the inverting input terminal of the operational amplifier 130 and the other end connected to the output terminal of the operational amplifier 130.

The read operation of the MRAM having the above arrangement will be described next by exemplifying a case where data is read out from the MRAM cell MC14. First of all, a voltage Vread is applied to the word line WL1 to which the selected cell MC14 is connected. In addition, the ground switch S404 connected to the sense line SL4 to which the selected cell MC14 is connected is turned off, and the remaining ground switches S401 to S403 are turned on. Furthermore, the write switch S500 in the read/write section 100-4 is turned off, and the read switch S600 is turned on. The voltage Vread is then applied to the word line WL1. As a result, a read current Iread flows through the selected cell MC14. This read current Iread flows into the operational amplifier 130 via the sense line SL4 and read switch S600. The current Iread is converted into a voltage by the resistive element 140. This voltage is then output as a read voltage Vout from the output terminal of the operational amplifier 130.

According to the above read method, the read precision can be improved by eliminating the influence of parasitic impedance existing in the selected sense line SL4. This point will be described with reference to FIG. 1B. FIG. 1B is a circuit diagram showing a parasitic impedance network existing in the selected sense line SL4 in reading data from the MRAM cell MC14.

As shown in FIG. 1B, when data is read out from the selected cell MC14, parasitic impedance networks 150 and 160-1 to 160-m exist in parallel with the selected cell MC14. The parasitic impedance network 150 is a parallel circuit of the memory cell impedances of the MRAM cells MC11 to MC13 connected to the selected word line WL1. In addition, the parasitic impedance networks 160-1 to 160-n (n=m−1) are connected in series with the parallel circuit of the memory cell impedances of the MRAM cells MC24 to MCm4 connected to the selected sense line SL4 and the memory cell impedances of the MRAM cells MC21 to MC23, MC31 to MC33, MC41 to MC43, . . . , MCm2 to MCm3 connected to the unselected word lines WL2 to WLm to which the respective MRAM cells MC24 to MCm4 are connected.

According to the above read method, the selected sense line SL4 is connected to the inverting input terminal of the operational amplifier. Therefore, the selected sense line SL4 is virtually grounded. In addition, all the unselected sense lines SL1 to SL3 are grounded. Therefore, the influences of parasitic impedances produced by unselected cells can be eliminated, and the information written in the selected cell can be accurately read out.

According to the conventional MRAM, however, as the number of memory cells connected in parallel with each other increases, currents flowing to parasitic impedances increase in the early stage of sense operation, resulting in an increase in current consumption. As the currents flowing to the parasitic impedances increase, the amount of current flowing into the operational amplifier decreases. That is, a read signal decreases. As a consequence, it takes a longer period of time to stabilize the output of the operational amplifier by virtually grounding a bit line after the operational amplifier is started. Consequently, the data read rate decreases, and the data read precision deteriorates. This may make it difficult to increase the number of memory cells, i.e., the integration degree of an MRAM.

BRIEF SUMMARY OF THE INVENTION

A semiconductor memory device according to an aspect of the present invention comprises:

a memory cell array in which memory cells, each including a magnetoresistive element having first and second magnetic layers and a first insulating layer formed between the first and second magnetic layers, are arranged in the form of a matrix;

word lines connected to the first magnetic layers of the memory cells on each row of the memory cell array;

sub-sense lines connected to the second magnetic layers of the memory cells on each column of the memory cell array;

a main sense line connected to each of the sub-sense lines;

a row decoder which selects a word line of the memory cell array;

a column decoder which selects a sub-sense line of the memory cell array;

a first switch element which connects the sub-sense line selected by the column decoder to the main sense line;

a read circuit which reads out data from the memory cell selected by the row decoder and column decoder via the main sense line; and a write circuit which writes data in the memory cell selected by the row decoder and column decoder via the main sense line.

DETAILED DESCRIPTION OF THE INVENTION

Figure 1A:
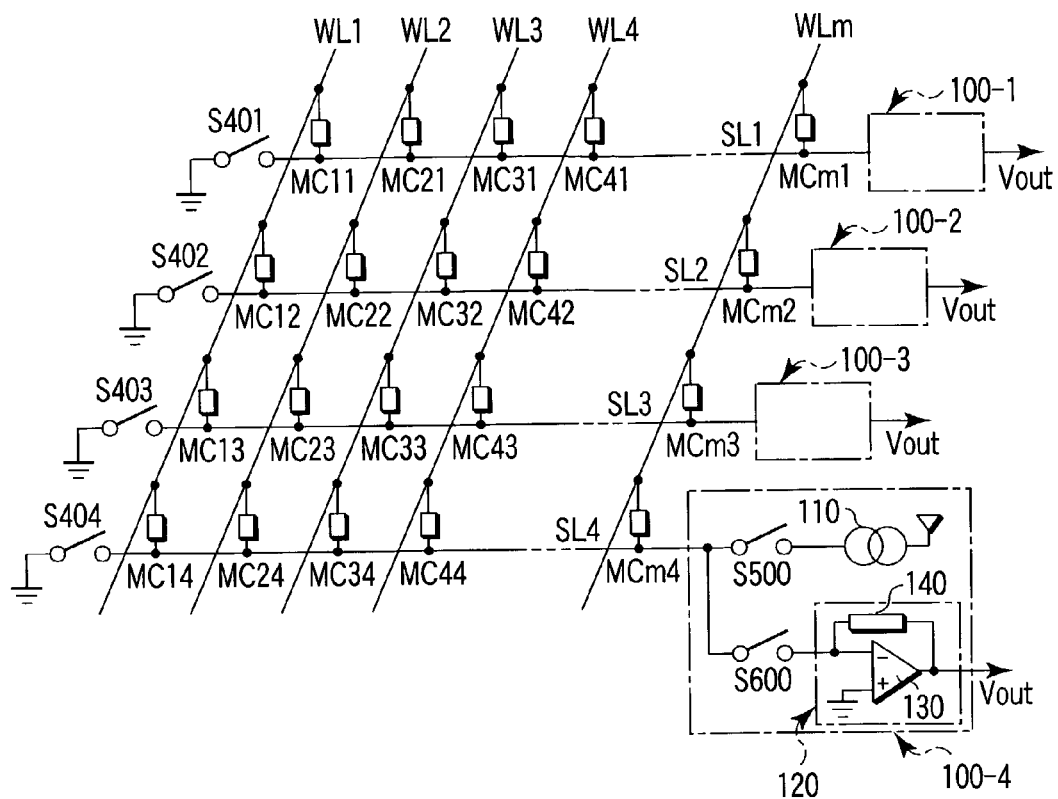
FIG. 1A is a block diagram showing a conventional MRAM.
Figure 1B:
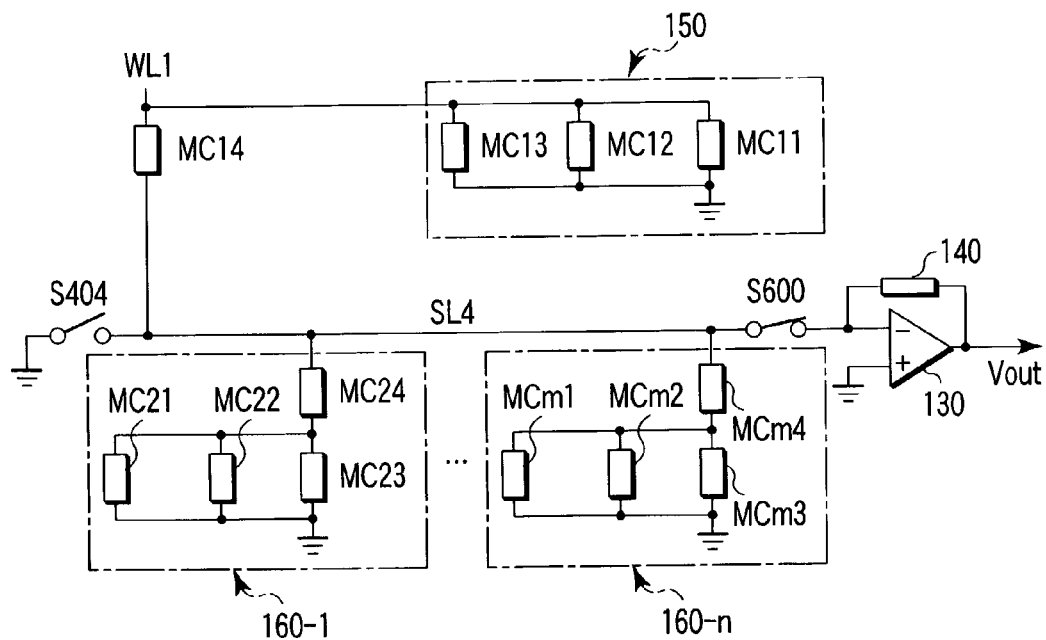
FIG. 1B is a block diagram showing the conventional MRAM, and more specifically, how parasitic impedances exist on sense lines in a read operation.
Figure 2:
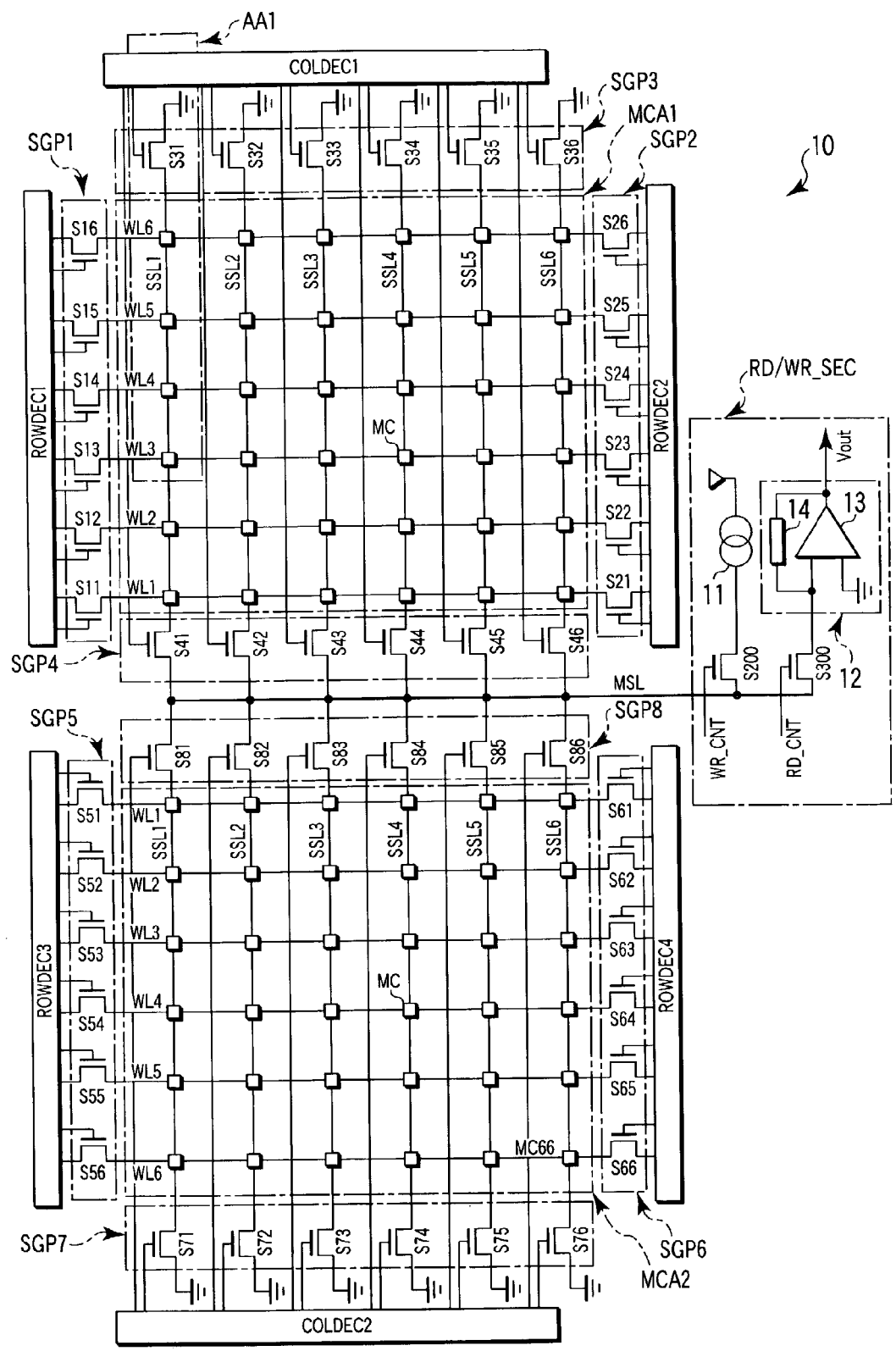
FIG. 2 is a block diagram showing an MRAM according to the first embodiment of the present invention.

A semiconductor memory device according to the first embodiment of the present invention will be described below with reference to FIG. 2. FIG. 2 is a block diagram of an MRAM.

As shown in FIG. 2, an MRAM 10 includes a memory cell arrays MCA1 and MCA2, switch groups SGP1 to SGP8, row decoders ROWDEC1 to ROWDEC4, column decoders COLDEC1 and COLDEC2, and read/write section RD/WR_SEC.

Figure 3A:
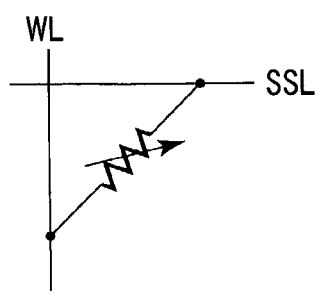
FIG. 3A is an equivalent circuit diagram of an MRAM cell according to the first embodiment of the present invention.
Figure 3B:
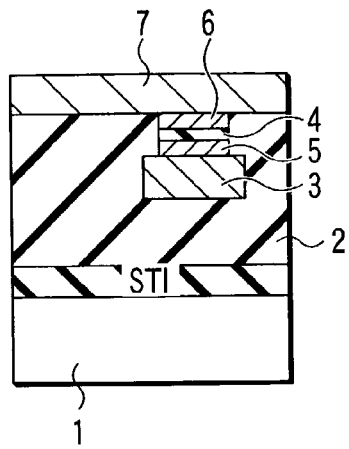
FIGS. 3B and 3C are sectional views of the MRAM cell in FIG. 3A.

Each of the memory cell arrays MCA1 and MCA2 has (6×6) memory cells MC arranged in the form of a matrix. The memory cells MC are arranged at the intersections of a plurality of word lines WL1 to WL6 and sub-sense lines SSL1 to SSL6 perpendicular to the word lines WL1 to WL6. FIG. 2 shows the (6×6) memory cell arrays. However, this is an example, and the number of memory cells MC in the memory cell arrays MCA1 and MCA2 are not specifically limited. The memory cell MC is, for example, an MRAM cell with a TMR element. FIGS. 3A and 3B show an example of the MRAM cell. FIG. 3A is an equivalent circuit diagram of the MRAM cell. FIG. 3B is a sectional view of the MRAM cell.

As shown in FIGS. 3A and 3B, an MRAM cell is formed from a TMR element. More specifically, a metal interconnection layer 3 serving as a word line WL is formed in a dielectric interlayer 2 formed on a silicon substrate 1. A TMR element having an insulating film 4 sandwiched between magnetic films 5 and 6 is formed on the metal interconnection layer 3. In addition, a metal interconnection layer 7 serving as a sub-sense line SSL extends in a direction perpendicular to the word line WL on the magnetic film 6. The direction of the spin of the magnetic film 6 is set in a predetermined direction. In this state, the direction of spin of the magnetic film 5 is made to be parallel or antiparallel to that of the magnetic film 6 so as to create two states, thereby writing "0"- or "1"-data.

Figure 3C:
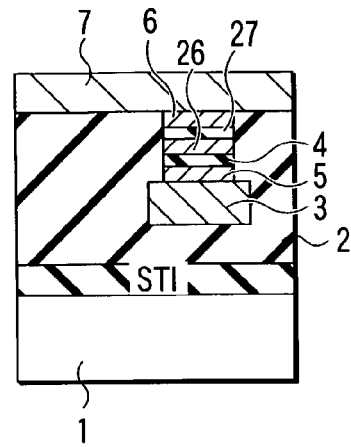

FIG. 3C is a sectional view of an MRAM cell with a different structure to the one shown in FIG. 3B. As shown in FIG. 3C, in the structure shown in FIG. 3B, a magnetic film 26 is formed on the insulating film 4, an insulating film 27 is formed on the magnetic film 26, and the magnetic film 6 is formed on the insulating film 27. The directions of the spins of the magnetic films 5 and 6 are set in advance in a predetermined direction so as to coincide with each other. In this state, the direction of the spin of the magnetic film 26 is made to be parallel or antiparallel to that of the magnetic films 5 and 6, thereby writing "0" or "1"-data. The structure shown in FIG. 3C can obtain a higher MR ratio than the structure shown in FIG. 3B, and hence is superior in reliability from the viewpoint of data retention. Note that the MR ratio is the ratio of the resistance of the TMR element in the "0"-data write state to that in "1"-data write state.

Referring back to FIG. 2, the switch groups SGP1 and SGP2 respectively have switching transistors S11 to S16 and S21 to S26. The gate and one of the source and drain of each of the switching transistors S11 to S16 is connected to the row decoder ROWDEC1, and the other of the source and drain of each switching transistor is connected to one end of each of the word lines WL1 to WL6 in the memory cell array MCA1. The gate and one of the source and drain of each of the switching transistors S21 to S26 is connected to the row decoder ROWDEC2, and the other of the source and drain of each switching transistor is connected to the other end of each of the word lines WL1 to WL6 in the memory cell array MCA1.

The switch groups SGP3 and SGP4 respectively have six switching transistors S31 to S36 and six switching transistors S41 to S46. The gates of the switching transistors S31 to S36 are connected to the column decoder COLDEC1. One of the source and drain of each of these switching transistors is connected to ground potential, and the other of the source and drain of each switching transistor is connected to one end of each of the sub-sense lines SSL1 to SSL6 in the memory cell array MCA1. The gates of the switching transistors S41 to S46 are connected to the column decoder COLDEC1. One of the source and drain of each of these switching transistors is connected to the main sense line MSL, and the other of the source and drain of each switching transistor is connected to the other end of each of the sub-sense lines SSL1 to SSL6 in the memory cell array MCA1.

The switch groups SGP5 and SGP6 respectively have six switching transistors S51 to S56 and six switching transistors S61 to S66. The gate and one of the source and drain of each of the switching transistors S51 to S56 are connected to the row decoder ROWDEC3, and the other of the source and drain of each switching transistor is connected to one end of each of the word lines WL1 to WL6 in the memory cell array MCA2. The gate and one of the source and drain of each of the switching transistors S61 to S66 are connected to the row decoder ROWDEC4, and the other of the source and drain of each switching transistor is connected to the other end of each of the word lines WL1 to WL6 in the memory cell array MCA2.

The switch groups SGP7 and SGP8 respectively have six switching transistors S71 to S76 and six switching transistors S81 to S86. The gates of the switching transistors S71 to S76 are connected to the column decoder COLDEC2. One of the source and drain of each of these switching transistors is connected to the ground potential, and the other of the source and drain of each switching transistor is connected to one end of each of the sub-sense lines SSL1 to SSL6 in the memory cell array MCA2. The gates of the switching transistors S81 to S86 are connected to the column decoder COLDEC2. One of the source and drain of each of these switching transistors is connected to the main sense line MSL, and the other of the source and drain of each switching transistor is connected to the other end of each of the sub-sense lines SSL1 to SSL6 in the memory cell array MCA2.

The row decoders ROWDEC1 to ROWDEC4 respectively control the switching transistors included in the switch groups SGP1, SGP2, SGP5, and SGP6, and apply predetermined potentials to the word lines WL1 to WL6.

The column decoder COLDEC1 controls the switching transistors included in the switch groups SGP3 and SGP4, and the column decoder COLDEC2 controls the switching transistors included in the switch groups SGP7 and SGP8. Each column decoder determines the potentials of the sub-sense lines SSL1 to SSL6 and switches between connection and disconnection for the main sense line MSL.

As described above, the main sense line MSL, to which the 12 sub-sense lines SSL1 to SSL6 and SSL1 to SSL6 are connected via the switch groups SGP4 and SGP8, is connected to the read/write section RD/WR_SEC. The read/write section RD/WR_SEC includes a write switching transistor S200, read switching transistor S300, write current source 11, and sense circuit 12. The write current source 11 and sense circuit 12 are connected to the main sense line MSL via the write switching transistor S200 and read switching transistor S300. The gates of the write switching transistor S200 and read switching transistor S300 are respectively connected to a write control signal line WR_CNT and read control signal line RD_CNT to which write and read control signals are respectively input. The sense circuit 12 has an operational amplifier 13 and current/voltage converter (resistive element) 14. The operational amplifier 13 has a noninverting input terminal connected to ground potential, an inverting input terminal connected to the main sense line MSL via the read switching transistor S300, and an output terminal. The resistive element 14 has one end connected to the inverting input terminal of the operational amplifier 13, and the other end connected to the output terminal of the operational amplifier 13. The write current source 11 supplies a current Iwrite to the main sense line MSL via the write switching transistor S200 in a write operation. In a read operation, the sense circuit 12 converts a read current Iread input from the main sense line MSL via the read switching transistor S300 into a voltage using the resistive element 14, and outputs it as a read voltage Vout.

The operation of the MRAM having the above arrangement will be described next. Write operation will be described first by exemplifying a case where data is written in a memory cell MC66 placed at the intersection of the sub-sense line SSL6 and word line WL6 in the memory array MCA2.

First of all, the column decoder COLDEC2 turns on the switching transistor S86 in the switch group SGP8 to connect the sub-sense line SSL6 in the memory array MCA2 to the main sense line MSL. The column decoder COLDEC2 also turns on the switching transistor S76 in the switch group SGP7 to connect the sub-sense line SSL6 to ground potential. In addition, the write switching transistor S200 is turned on by supplying a write control signal to the write control signal line WR_CNT. With this operation, the current Iwrite flows from the write current source 11 to the sub-sense line SSL6 in the memory array MCA2 via the main sense line MSL. Note that the switching transistors S81 to S85 in the switch group SGP8, the switching transistors S71 to S76 in the switch group SGP7, and all the switching transistors in the switch group SGP4 are set in the OFF state. The switching transistors in the switch group SGP3 may be set in either the ON state or the OFF state.

The row decoders ROWDEC3 and ROWDEC4 then turn on the switching transistor S56 in the switch group SGP5 and the switching transistor S66 in the switch group SGP6. A current is then supplied from either the row decoder ROWDEC3 side or the row decoder ROWDEC4 side to the word line WL6. A magnetic field is formed around the word line WL6 by a current flowing through the word line WL6, and the direction of the spin of the magnetic film 5 (see FIG. 3B) or magnetic film 26 (see FIG. 3C) is changed by this magnetic field. The direction of this spin is determined by the direction of a current flowing through the word line WL6. That is, by controlling the direction of a current, two states can be created, i.e., whether the direction of the spin of the magnetic film 5 is parallel or antiparallel to the direction of the spin of the magnetic film 6. Alternatively, two states, i.e., whether the direction of the spin of the magnetic film 26 is parallel to antiparallel to the direction of the spin of the magnetic films 5 and 6, can be created. As a consequence, "0"- or "1"-data can be written in the memory cell MC66. Note that the switching transistors S51 to S55 in the switch group SGP5 and the switching transistors S61 to S65 in the switch group SGP6 are set in the OFF state. The switching transistors in the switch groups SGP1 and SGP2 may be set in either the ON state or the OFF state.

A read operation will be described next by exemplifying a case wherein data is read out from the memory cell MC66.

First of all, the row decoder ROWDEC3 turns on the switching transistor S56 in the switch group SGP5, and the row decoder ROWDEC4 turns off the switching transistor S66 in the switch group SGP6. A current is then supplied to the memory cell MC66 by applying a voltage Vread to the word line WL6 in the memory array MCA2. In this case, all the remaining word lines WL1 to WL5 are set at ground potential or in the floating state.

The column decoder COLDEC2 then turns on the switching transistor S86 in the switch group SGP8 to connect the sub-sense line SSL6 in the memory array MCA2 to the main sense line MSL. The column decoder COLDEC2 also turns off the switching transistor S76 in the switch group SGP7. The remaining switching transistors S81 to S85 connected to the main sense line MSL and all the switching transistors in the switch group SGP4 are set in the OFF state. In addition, the unselected sub-sense lines SSL1 to SSL5 are set at ground potential by setting the switching transistors S71 to S75 in the switch group SGP7 in the ON state. The switching transistors in the switch group SGP3 may be set in either ON state or the OFF state.

In addition, a read control signal is supplied to the read control signal line RD_CNT to turn on the read switching transistor S300, thereby connecting the sense circuit 12 to the main sense line MSL.

Upon application of the voltage Vread, the read current Iread flows from the memory cell MC66 to the main sense line MSL via the sub-sense line SSL6, and the read current Iread flows into the sense circuit 12. The read current Iread is converted into a voltage by the resistive element 14 and output as the read voltage Vout from the output terminal of the operational amplifier 13.

As described above, according to the MRAM of the first embodiment of the present invention, the main sense line MSL is connected to the inverting input terminal of the operational amplifier 13. The main sense line MSL is therefore virtually grounded. This makes it possible to eliminate the influences of parasitic impedances produced by unselected cells and accurately read out the information written in a selected cell.

In addition, the memory cell array is divided into arrays by arranging sense lines in a hierarchical bit line architecture including a main sense line and sub-sense lines. As compared with a case wherein cell arrays having the same capacity are arranged by a conventional method, parasitic impedance related to a selected cell can be reduced. When an MRAM having the same capacity as that of the arrangement shown in FIG. 2 is formed by the conventional method, one memory cell array includes (12×6)=72 memory cells. If, therefore, one memory cell is selected, 71 unselected cells exist as parasitic impedances on the sense line. According to this embodiment, an MRAM is formed by two memory cell arrays each including (6×6) memory cells of 72 memory cells. Therefore, only 35 unselected cells exist as parasitic impedances on the main sense line MSL. This can prevent an increase in the amount of current, of the read current Iread, which flows to the parasitic impedances, thus suppressing an increase in current consumption. In other words, the read current Iread can be efficiently supplied to the sense circuit 12. At the same time, since a decrease in the signal level of a read signal can be suppressed, high data read precision can be maintained even with an increase in the number of memory cells. This will lead to the realization of a further increase in the integration degree of MRAMs.

Figure 4A:
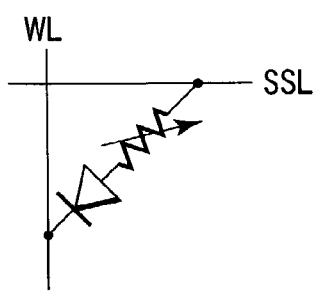
FIG. 4A is an equivalent circuit diagram of the MRAM cell according to the first embodiment of the present invention.
Figure 4B:
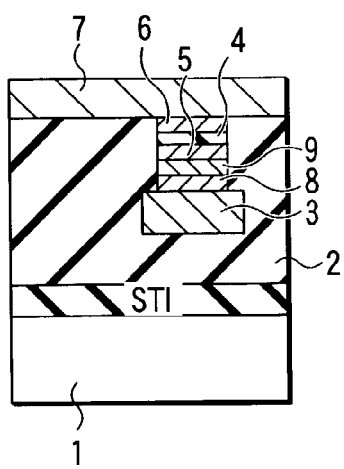
FIGS. 4B and 4C are sectional views of the MRAM cell in FIG. 4A.
Figure 4C:
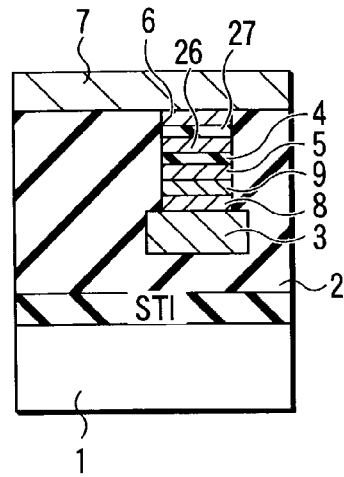

Note that each MRAM cell may be formed solely by a TMR element as shown in FIGS. 3A to 3C or a combination of a TMR element and a rectifying element. FIGS. 4A to 4C show an MRAM cell including a TMR element and diode. FIG. 4A is an equivalent circuit diagram of the MRAM cell. FIGS. 4B and 4C are sectional views of the cell. As shown in FIGS. 4A to 4C, in the structure shown in FIGS. 3B and 3C, a diode is connected in series with a TMR element between the word line WL and the sub-sense line SSL by forming an n-type semiconductor layer 8 and p-type semiconductor layer 9 between the metal interconnection layer 3 serving as the word line WL and the magnetic film 5.

Figure 5:
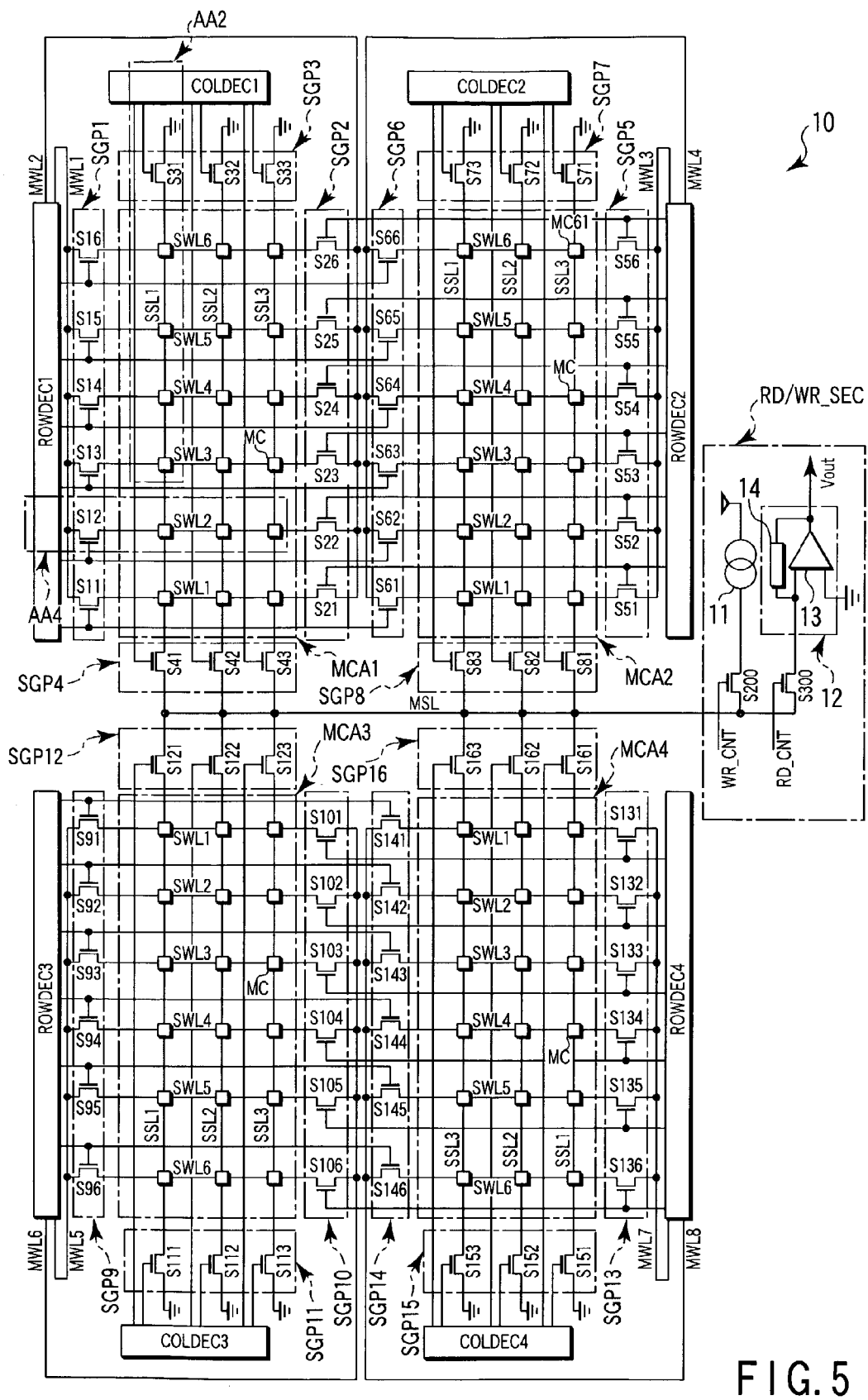
FIG. 5 is a block diagram showing an MRAM according to the second embodiment of the present invention.

A semiconductor memory device according to the second embodiment of the present invention will be described next with reference to FIG. 5. FIG. 5 is a block diagram of an MRAM. The MRAM according to this embodiment further uses a hierarchical word line architecture.

As shown in FIG. 5, an MRAM 10 includes memory cell array MCA1 to MCA4, switch groups SGP1 to SGP16, row decoders ROWDEC1 to ROWDEC4, column decoders COLDEC1 to COLDEC4, and read/write section RD/WR_SEC.

Each of the memory array MCA1 to MCA4 has (6×3) memory cells MC arranged in the form of a matrix. The respective memory cells MC are arranged at the intersections of a plurality of sub-word lines SWL1 to SWL6 and sub-sense lines SSL1 to SSL3 perpendicular to the sub-word lines SWL1 to SWL6. Obviously, the number of memory cells MC included in each of the memory cell array MCA1 to MCA4 is not limited to (6×3). The memory cell MC is an MRAM cell including a TMR element, which has the structure shown in FIGS. 3A to 3C or 4A to 4C described in the first embodiment.

The switch groups SGP1 and SGP2 respectively have six switching transistors S11 to S16 and six switching transistors S21 to S26. The gates of the switching transistors S11 to S16 are connected to the row decoder ROWDEC1. One of the source and drain of each of these switching transistors is connected a main word line MWL1, and the other of the source and drain of each switching transistor is connected to one end of each of the sub-word lines SWL1 to SWL6 in the memory array MCA1. The gates of the switching transistors S21 to S26 are connected to the row decoder ROWDEC2. One of the source and drain of each of these switching transistors is connected a main word line MWL2, and the other of the source and drain of each switching transistor is connected to the other end of each of the sub-word lines SWL1 to SWL6 in the memory array MCA1.

The switch groups SGP3 and SGP4 respectively have three switching transistors S31 to S33 and three switching transistors S41 to S43. The gates of the switching transistors S31 to S33 are connected to the column decoder COLDEC1. One of the source and drain of each of these switching transistors is connected to ground potential, and the other of the source and drain of each switching transistor is connected to one end of each of the sub-sense lines SSL1 to SSL3 in the memory array MCA1. The gates of the switching transistors S41 to S43 are connected to the column decoder COLDEC1. One of the source and drain of each of these switching transistors is connected to a main sense line MSL, and the other of the source and drain of each switching transistor is connected to the other end of each of the sub-sense lines SSL1 to SSL3 in the memory array MCA1.

The switch groups SGP5 and SGP6 respectively have six switching transistors S51 to S56 and six switching transistors S61 to S66. The gates of the switching transistors S51 to S56 are connected to the row decoder ROWDEC2. One of the source and drain of each of these switching transistors is connected to a main word line MWL3, and the other of the source and drain of each switching transistor is connected to one end of each of the sub-word lines SWL1 to SWL6 in the memory array MCA2. The gates of the switching transistors S61 to S66 are connected to the row decoder ROWDEC1. One of the source and drain of each of these switching transistors is connected to a main word line MWL4, and the other of the source and drain of each switching transistor is connected to the other end of each of the sub-word lines SWL1 to SWL6 in the memory array MCA2.

The switch groups SGP7 and SGP8 respectively have three switching transistors S71 to S73 and three switching transistors S81 to S83. The gates of the switching transistors S71 to S73 are connected to the column decoder COLDEC2. One of the source and drain of each of these switching transistors is connected to ground potential, and the other of the source and drain of each switching transistor is connected to one end of each of the sub-sense lines SSL1 to SSL3 in the memory array MCA2. The gates of the switching transistors S81 to S83 are connected to the column decoder COLDEC2. One of the source and drain of each of these switching transistors is connected to the main sense line MSL, and the other of the source and drain of each switching transistor is connected to the other end of each of the sub-sense lines SSL1 to SSL3 in the memory array MCA2.

The switch groups SGP9 and SGP10 respectively have six switching transistors S91 to S96 and six switching transistors S101 to S106. The gates of the switching transistors S91 to S96 are connected to the row decoder ROWDEC3. One of the source and drain of each of these switching transistors is connected to a main word line MWL5, and the other of the source and drain of each switching transistor is connected to one end of each of the sub-word lines SWL1 to SWL6 in the memory array MCA3. The gates of the switching transistors S101 to S106 are connected to the row decoder ROWDEC4. One of the source and drain of each of these switching transistors is connected to a main word line MWL6, and the other of the source and drain of each switching transistor is connected to the other end of each of the sub-word lines SWL1 to SWL6 in the memory array MCA3.

The switch groups SGP11 and SGP12 respectively have three switching transistors S111 to S113 and three switching transistors S121 to S123. The gates of the switching transistors S111 to S113 are connected to the column decoder COLDEC3. One of the source and drain of each of these switching transistors is connected to ground potential, and the other of the source and drain of each switching transistor is connected to one end of each of the sub-sense lines SSL1 to SSL3 in the memory array MCA3. The gates of the switching transistors S121 to S123 are connected to the column decoder COLDEC3. One of the source and drain of each of these switching transistors is connected to the main sense line MSL, and the other of the source and drain of each switching transistor is connected to the other end of each of the sub-sense lines SSL1 to SSL3 in the memory array MCA3.

The switch groups SGP13 and SGP14 respectively have six switching transistors S131 to S136 and six switching transistors S141 to S146. The gates of the switching transistors S131 to S136 are connected to the row decoder ROWDEC4. One of the source and drain of each of these switching transistors is connected to a main word line MWL7, and the other of the source and drain of each switching transistor is connected to one end of each of the sub-word lines SWL1 to SWL6 in the memory array MCA4. The gates of the switching transistors S141 to S146 are connected to the row decoder ROWDEC3. One of the source and drain of each of these switching transistors is connected to a main word line MWL8, and the other of the source and drain of each switching transistor is connected to the other end of each of the sub-word lines SWL1 to SWL6 in the memory array MCA4.

The switch groups SGP15 and SGP16 respectively have three switching transistors S151 to S153 and three switching transistors S161 to S163. The gates of the switching transistors S151 to S153 are connected to the column decoder COLDEC4. One of the source and drain of each of these switching transistors is connected to ground potential, and the other of the source and drain of each switching transistor is connected to one end of each of the sub-sense lines SSL1 to SSL3 in the memory array MCA4. The gates of the switching transistors S161 to S163 are connected to the column decoder COLDEC4. One of the source and drain of each of these switching transistors is connected to the main sense line MSL, and the other of the source and drain of each switching transistor is connected to the other end of each of the sub-sense lines SSL1 to SSL3 in the memory array MCA4.

The row decoder ROWDEC1 controls the switching transistors included in the switch groups SGP1 and SGP6. The row decoder ROWDEC1 connects one of the sub-word lines SWL1 to SWL6 in the memory array MCA1 to the main word line MWL1, and connects one of the sub-word lines SWL1 to SWL6 in the memory array MCA2 to the main word line MWL4. The row decoder ROWDEC1 also selects the main word line MWL1 or MWL2 and sets the sub-word lines SWL1 to SWL6 in the memory array MCA1 in the write state, read state, or ground potential state.

The row decoder ROWDEC2 controls the switching transistors included in the switch groups SGP2 and SGP5. The row decoder ROWDEC2 connects one of the sub-word lines SWL1 to SWL6 in the memory array MCA1 to the main word line MWL2, and connects one of the sub-word lines SWL1 to SWL6 in the memory array MCA2 to the main word line MWL3. The row decoder ROWDEC2 also selects the main word line MWL3 or MWL4 and sets the sub-word lines SWL1 to SWL6 in the memory array MCA2 in the write state, read state, or ground potential state.

The row decoder ROWDEC3 controls the switching transistors included in the switch groups SGP9 and SGP14. The row decoder ROWDEC3 connects one of the sub-word lines SWL1 to SWL6 in the memory array MCA3 to the main word line MWL5, and connects one of the sub-word lines SWL1 to SWL6 in the memory array MCA4 to the main word line MWL8. The row decoder ROWDEC3 also selects the main word line MWL5 or MWL6 and sets the sub-word lines SWL1 to SWL6 in the memory array MCA3 in the write state, read state, or ground potential state.

The row decoder ROWDEC4 controls the switching transistors included in the switch groups SGP10 and SGP13.

The row decoder ROWDEC4 connects one of the sub-word lines SWL1 to SWL6 in the memory array MCA3 to the main word line MWL6, and connects one of the sub-word lines SWL1 to SWL6 in the memory array MCA4 to the main word line MWL7. The row decoder ROWDEC4 also selects the main word line MWL7 or MWL8 and sets the sub-word lines SWL1 to SWL6 in the memory array MCA4 in the write state, read state, or ground potential state.

The column decoder COLDEC1 controls the switching transistors included in the switch group SGP3 and SGP4. The column decoder COLDEC1 determines the potentials of the sub-sense lines SSL1 to SSL6 in the memory array MCA1, and switches between connection and disconnection for the main sense line MSL.

The column decoder COLDEC2 controls the switching transistors included in the switch group SGP7 and SGP8. The column decoder COLDEC2 determines the potentials of the sub-sense lines SSL1 to SSL6 in the memory array MCA2, and switches between connection and disconnection for the main sense line MSL.

The column decoder COLDEC3 controls the switching transistors included in the switch group SGP11 and SGP12. The column decoder COLDEC3 determines the potentials of the sub-sense lines SSL1 to SSL6 in the memory array MCA3, and switches between connection and disconnection for the main sense line MSL.

The column decoder COLDEC4 controls the switching transistors included in the switch group SGP15 and SGP16. The column decoder COLDEC4 determines the potentials of the sub-sense lines SSL1 to SSL6 in the memory array MCA4, and switches between connection and disconnection for the main sense line MSL.

As described above, the main sense line MSL, to which the 12 sub-sense lines SSL1 to SSL6, SSL1 to SSL6, SSL1 to SSL6, and SSL1 to SSL6 are connected via the switch groups SGP4, SGP8, SGP12, and SGP16, is connected to the read/write section RD/WR_SEC. Since the read/write section RD/WR_SEC has the same arrangement as that in the first embodiment, a description thereof will be omitted.

The operation of the MRAM having the above arrangement will be described next. Write operation will be described first by exemplifying a case wherein data is written in the memory cell MC61 placed at the intersection of the sub-word line SWL6 and sub-sense line SSL1 in the memory array MCA2.

First of all, the column decoder COLDEC2 turns on the switching transistor S81 in the switch group SGP8 to connect the sub-sense line SSL1 in the memory array MCA2 to the main sense line MSL. The column decoder COLDEC2 also turns on the switching transistor S71 in the switch group SGP7 to connect the sub-sense line SSL1 in the memory array MCA2 to ground potential. In addition, a write control signal is supplied to the write control signal line WR_CNT to turn on the write switching transistor S200. The current Iwrite is then supplied from the write current source 11 to the sub-sense line SSL1 in the memory array MCA2 via the main sense line MSL. Note that the switching transistors S82 and S83 in the switch group SGP8, the switching transistors S72 and S73 in the switch group SGP7, and all the switching transistors in the switch groups SGP4, SGP12, and SGP16 are set in the OFF state. With this operation, the sub-sense lines SSL2 and SSL3 in the memory array MCA2 and the sub-sense lines SSL1 to SSL3 in the memory arrays MCA1, MCA3, and MCA4 are electrically disconnected from the main sense line MSL. The switching transistors in the switch groups SGP3, SGP11, and SGP15 may be set in either the ON state or the OFF state.

The row decoders ROWDEC1 and ROWDEC2 then respectively turn on the switching transistor S66 in the switch group SGP6 and the switching transistor S56 in the switch group SGP5. The row decoder ROWDEC2 selects the main word line MWL3 or MWL4 and applies a voltage to the selected one, thereby supplying a current from the selected main word line to the sub-word line SWL6. "0"- or "1"-data is written in the memory cell MC61 depending on the direction of a current flowing through the sub-word line SWL6. Note that the switching transistors S51 to S55 in the switch group SGP5, the switching transistors S61 to S65 in the switch group SGP6, and all the switching transistors in the switch group SGP9, SGP10, SGP13, and SGP14, which are connected to the remaining main word lines, are set in the OFF state.

A read operation will be described next by exemplifying a case wherein data is read out from the memory cell MC61.

First of all, the ROWDEC2 selects the main word line MWL3 and applies the voltage Vread to the main word line MWL3. The row decoder ROWDEC2 turns on the switching transistor S56 in the switch group SGP5. The row decoder ROWDEC1 turns off the switching transistor S66 in the switch group SGP6. With this operation, the voltage Vread is applied to the sub-word line SWL6 in the memory array MCA2. In this case, all the unselected sub-word lines are set at ground potential or in the floating state.

The column decoder COLDEC2 turns on the switching transistor S81 in the switch group SGP8 to connect the sub-sense line SSL1 in the memory array MCA2 to the main sense line MSL. The column decoder COLDEC2 also turns off the switching transistor S71 in the switch group SGP7. The remaining switching transistors S82 and S83 connected to the main sense line MSL and all the switching transistors in the switch groups SGP4, SGP12, and SGP16 are set in the OFF state. With this operation, the sub-sense lines SSL2 and SSL3 in the memory array MCA2 and the sub-sense lines SSL1 to SSL3 in the memory arrays MCA1, MCA3, and MCA4 are electrically disconnected from the main sense line MSL. In addition, by setting the switching transistors S72 and S73 in the switch group SGP7 in the ON state, the unselected sub-sense lines SSL2 and SSL3 in the memory array MCA2 are set at ground potential. The switching transistors in the switch groups SGP3, SGP11, and SW-GROUP15 may be set in either the ON state or the OFF state.

In addition, a read control signal is supplied to the read control signal line RD_CNT to turn on the read switching transistor S300, thereby connecting the sense circuit 12 to the main sense line MSL.

Upon application of the voltage Vread, the read current Iread flows from the memory cell MC61 to the main sense line MSL via the sub-sense line SSL1, and the read current Iread flows into the sense circuit 12. The read current Iread is converted into a voltage by the resistive element 14 and output as the read voltage Vout from the output terminal of the operational amplifier 13.

As described above, according to the MRAM of the second embodiment of the present invention, as in the first embodiment, the influence of the parasitic impedance produced by unselected cells can be eliminated, and the information written in a selected cell can be accurately read out.

In addition, the memory cell array is divided into arrays by arranging sense lines in a hierarchical bit line architecture including a main sense line and sub-sense lines and also arranging word lines in a hierarchical word line architecture including main word lines and sub-word lines. As compared with the first embodiment, therefore, the parasitic impedance related to a selected cell can be reduced. In this embodiment, an MRAM is formed by four memory cell arrays each including (6×3) memory cells of 72 memory cells. In a read operation, therefore, only 17 unselected cells exist as parasitic impedances on the main sense line MSL. As a consequence, the read current Iread can be efficiently supplied to the sense circuit 12. This makes it possible to further improve the effect described in the first embodiment.

Figure 6:
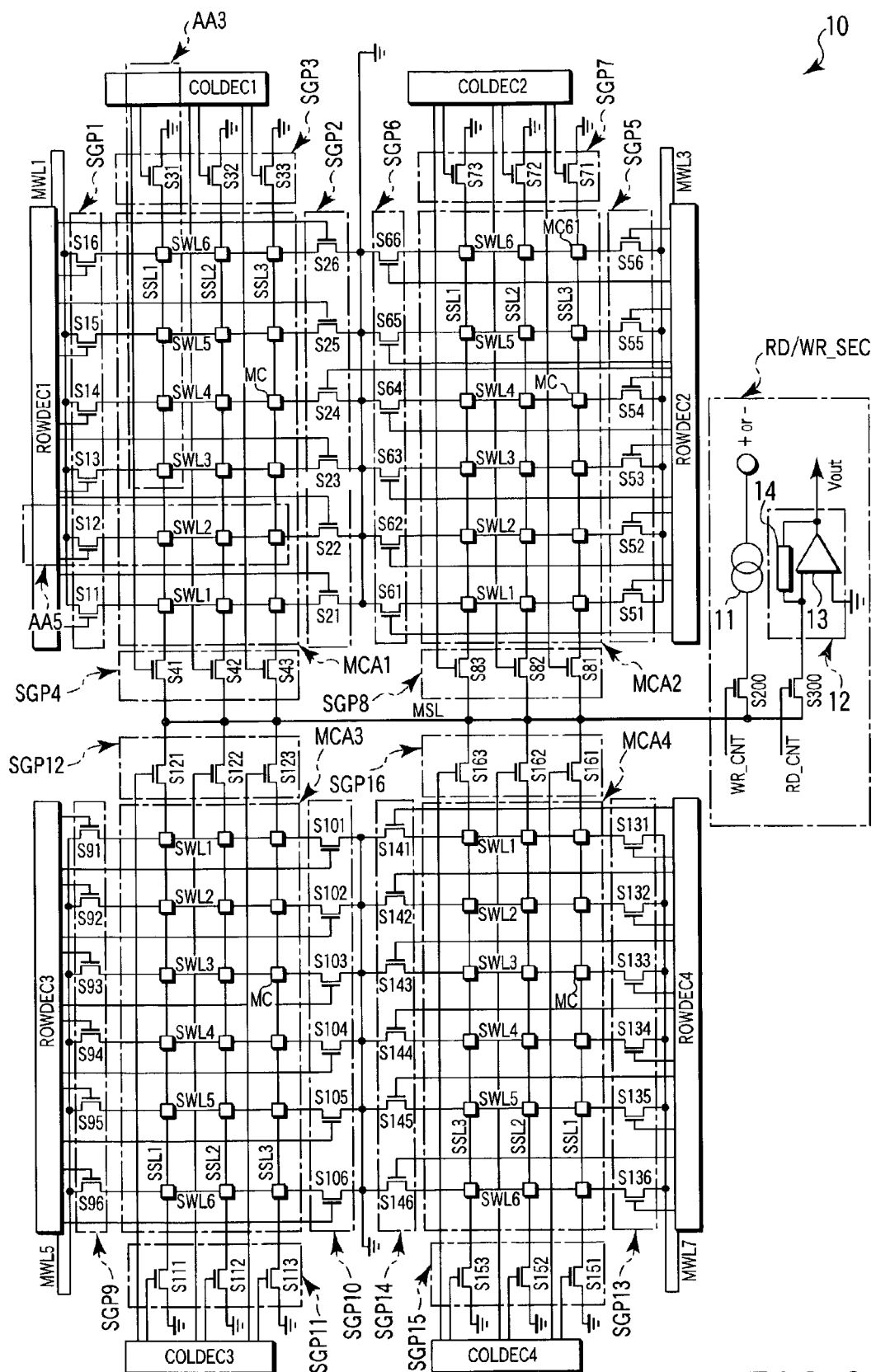
FIG. 6 is a block diagram showing an MRAM according to the third embodiment of the present invention.

A semiconductor memory device according to the third embodiment of the present invention will be described next with reference to FIG. 6. FIG. 6 is a block diagram of an MRAM. The MRAM according to this embodiment is designed such that the direction of the current supplied from the write current source 11 can be changed in the second embodiment. Since the structure of the MRAM according to this embodiment is similar to that according to the second embodiment, only the differences between the two embodiments will be described.

As shown in FIG. 6, the MRAM according to this embodiment is designed such that the main word lines MWL2, MWL4, MWL6, and MWL8 in the MRAM according to the second embodiment described above are omitted. The gates of switching transistors S21 to S26 in a switch group SGP2 are connected to a row decoder ROWDEC1. One of the source and drain of each of these switching transistors is connected to ground potential, and the other of the source and drain of each switching transistor is connected to a corresponding one of sub-word lines SWL1 to SWL6 in a memory array MCA1. The gates of switching transistors S61 to S66 in a switch group SGP6 are connected to a row decoder ROWDEC2. One of the source and drain of each of these switching transistors is connected to ground potential, and the other of the source and drain of each switching transistor is connected to a corresponding one of sub-word lines SWL1 to SWL6 in a memory array MCA2. The gates of switching transistors S101 to S106 in a switch group SGP10 are connected to a row decoder ROWDEC3. One of the source and drain of each of these switching transistors is connected to ground potential, and the other of the source and drain of each switching transistor is connected to a corresponding one of sub-word lines SWL1 to SWL6 in a memory array MCA3. The gates of switching transistors S141 to S146 in a switch group SGP14 are connected to a row decoder ROWDEC4. One of the source and drain of each of these switching transistors is connected to ground potential, and the other of the source and drain of each switching transistor is connected to a corresponding one of sub-word lines SWL1 to SWL6 in a memory array MCA4.

The row decoder ROWDEC1 controls the switching transistors included in a switch group SGP1 and the switch group SGP2. The row decoder ROWDEC1 also applies a potential to a main word line MWL1. With this operation, one of the sub-word lines SWL1 to SWL6 in the memory array MCA1 is connected to the main word line MWL1, and the sub-word lines SWL1 to SWL6 in the memory array MCA1 are set in the write state, read state, or ground potential state.

The row decoder ROWDEC2 controls the switching transistors included in a switch group SGP5 and the switch group SGP6. The row decoder ROWDEC2 also applies a potential to a main word line MWL3. With this operation, one of the sub-word lines SWL1 to SWL6 in the memory array MCA2 is connected to the main word line MWL3, and the sub-word lines SWL1 to SWL6 in the memory array MCA2 are set in the write state, read state, or ground potential state.

The row decoder ROWDEC3 controls the switching transistors included in a switch group SGP9 and the switch group SGP10. The row decoder ROWDEC3 also applies a potential to a main word line MWL5. With this operation, one of the sub-word lines SWL1 to SWL6 in the memory array MCA3 is connected to the main word line MWL5, and the sub-word lines SWL1 to SWL6 in the memory array MCA3 are set in the write state, read state, or ground potential state.

The row decoder ROWDEC4 controls the switching transistors included in a switch group SGP13 and the switch group SGP14. The row decoder ROWDEC4 also applies a potential to a main word line MWL7. With this operation, one of the sub-word lines SWL1 to SWL6 in the memory array MCA4 is connected to the main word line MWL7, and the sub-word lines SWL1 to SWL6 in the memory array MCA4 are set in the write state, read state, or ground potential state.

In addition, the power supply used for a write current source 11 in the read/write section RD/WR_SEC can be switched between a positive power supply and a negative power supply. This makes it possible to change the direction of a current Iwrite supplied from the write current source 11 to a main sense line MSL.

The operation of the MRAM having the above arrangement will be described next. Write operation will be described first by exemplifying a case where data is written in a memory cell MC61 placed at the intersection of the sub-word line SWL6 and the sub-sense line SSL1 in the memory array MCA2.

The column decoder COLDEC2 turns on a switching transistor S81 in a switch group SGP8 to connect the sub-sense line SSL1 in the memory array MCA2 to the main sense line MSL. The column decoder COLDEC2 also turns on a switching transistor S71 in a switch group SGP7 to connect the sub-sense line SSL1 in the memory array MCA2 to ground potential. In addition, a write control signal is supplies to a write control signal line WR_CNT to turn on a write switching transistor S200. By setting the power supply potential of the write current source 11 to a positive or negative potential, the write current Iwrite is supplied from the write current source 11 to the sub-sense line SSL1 in the memory array MCA2 via the main sense line MSL or in the reverse direction. Note that the switching transistors S82 and S83 in the switch group SGP8, the switching transistors S72 and S73 in the switch group SGP7, and all the switching transistors in the switch groups SGP4, SGP12, and SGP16 are set in the OFF state. With this operation, the sub-sense lines SSL2 and SSL3 in the memory array MCA2 and the sub-sense lines SSL1 to SSL3 in the memory arrays MCA1, MCA3, and MCA4 are electrically disconnected from the main sense line MSL. The switching transistors in the switch groups SGP3, SGP11, and SGP15 may be set in either the ON state or the OFF state.

The row decoder ROWDEC2 then turns on the switching transistors S56 and S66 in the switch groups SGP5 and SGP6. The row decoder ROWDEC2 applies a voltage to the main word line MWL3. With this operation, a current is supplied from the main word line MWL3 to the sub-word line SWL6. As a consequence, "0"- or "1"-data is written in the memory cell MC61 depending on the direction of the current flowing through the sub-sense line SSL1. Note that the switching transistors S51 to S55 in the switch group SGP5 and all the switching transistors in the switch groups SGP1, SGP9, and SGP13, which are connected to the remaining main word lines, are set in the OFF state. The switching transistors S61 to S65 in the switch group SGP6 and all the switching transistors in the switch groups SGP2, SGP10, and SGP14 may be set in either the ON state or OFF state.

Read operation will be described next by exemplifying a case wherein data is read out from the memory cell MC61.

The row decoder ROWDEC2 applies the voltage Vread to the main word line MWL3. The row decoder ROWDEC2 also turns on the switching transistor S56 in the switch group SGP5, and turns off the switching transistor S66 in the switch group SGP6. With this operation, the voltage Vread is applied to the sub-word line SWL6 in the memory array MCA2 to supply a current to the memory cell MC61. In this case, all the unselected sub-word lines are set at ground potential or in the floating state.

The column decoder COLDEC2 then turns on the switching transistor S81 in the switch group SGP8 to connect the sub-sense line SSL1 in the memory array MCA2 to the main sense line MSL. The column decoder COLDEC2 also turns off the switching transistor S71 in the switch group SGP7. The remaining switching transistors S82 and S83 and all the switching transistors in the switch groups SGP4, SGP12, and SGP16, which are connected to the main sense line MSL are set in the OFF state. With this operation, the sub-sense lines SSL2 and SSL3 in the memory array MCA2 and the sub-sense lines SSL1 to SSL3 in the memory arrays MCA1, MCA3, and MCA4 are electrically disconnected from the main sense line MSL. In addition, the switching transistors S72 and S73 in the switch group SGP7 are set in the ON state to set the unselected sub-sense lines SSL2 and SSL3 in the memory array MCA2 at ground potential. The switching transistors in the switch groups SGP3, SGP11, and SGP15 may be set in either the ON state or the OFF state.

In addition, a read control signal is supplied to the read control signal line RD_CNT to turn on the read switching transistor S300, thereby connecting the sense circuit 12 to the main sense line MSL.

As a consequence, as in the first and second embodiments, the read current Iread flowing out to the main sense line MSL is output as the read voltage Vout in the sense circuit 12.

As described above, according to the MRAM of the third embodiment of the present invention, the same effect as that of the second embodiment can be obtained. In addition, the direction of the write current Iwrite from the write current source 11 can be changed. Write data is controlled by controlling the direction of the write current Iwrite flowing in a sub-sense line. That is, in a write operation, the row decoders don't need to consider the directions of currents flowing through the sub-word lines SWL1 to SWL6. Therefore, there is no need to connect the switching transistors in each switch group connected to one end of each of the sub-word lines SWL1 to SWL6 to the row decoder. In this embodiment, the switch groups SGP2 and SGP6, and the switch groups SGP10 and SGP14 are arranged adjacent to each other, and the sources of the adjacent switching transistors are connected to ground potential via a common interconnection. This makes it possible to decrease the number of interconnections required to form an MRAM and reduce the chip area.

Figure 7A:
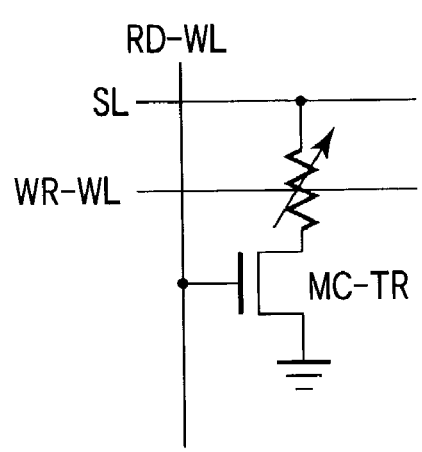
FIG. 7A is an equivalent circuit diagram of an MRAM cell according to the fourth embodiment of the present invention.
Figure 7B:
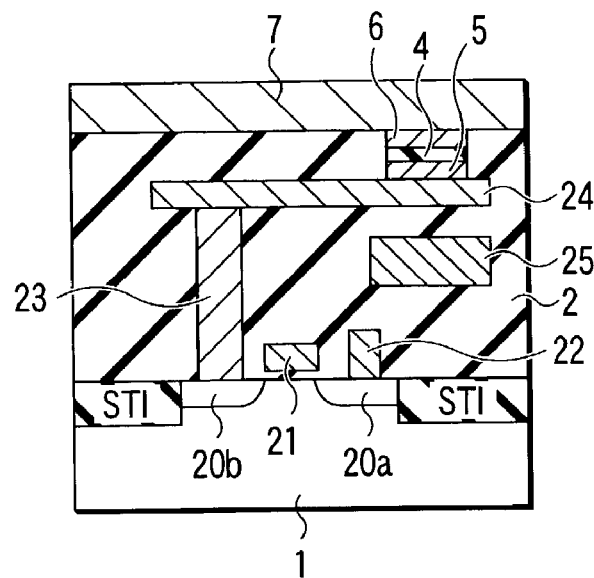
FIGS. 7B and 7C are sectional views of the MRAM cell in FIG. 7A.
Figure 7C:
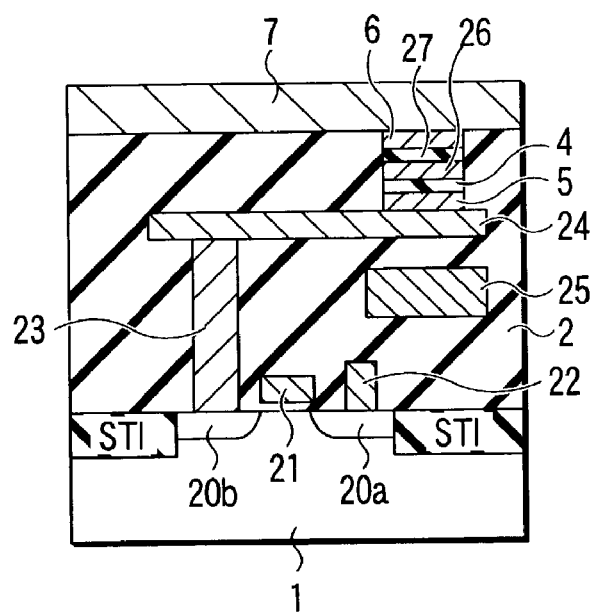
Figure 8:
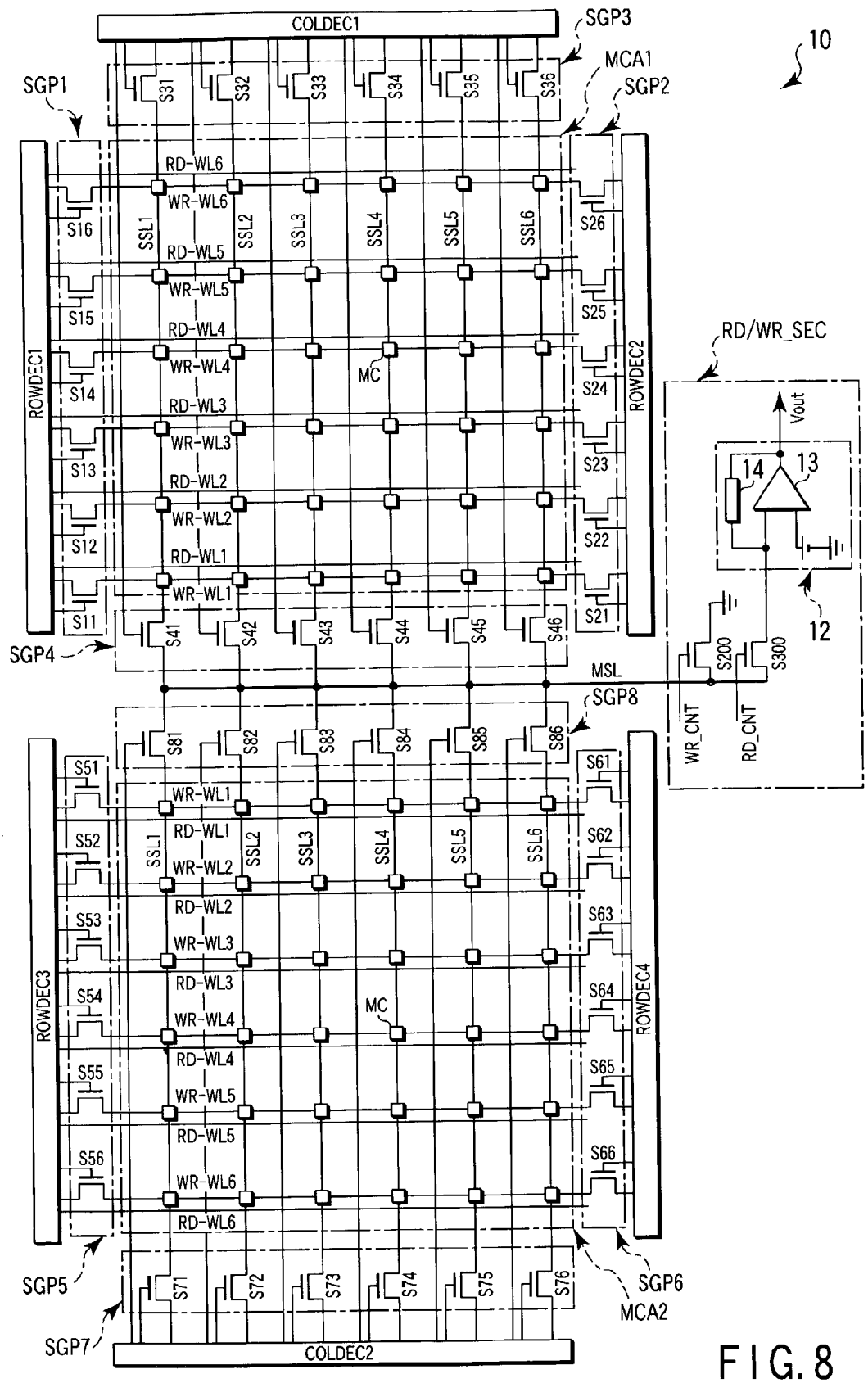
FIG. 8 is a block diagram showing an MRAM according to the fourth embodiment of the present invention.

A semiconductor memory device according to the fourth embodiment of the present invention will be described next with reference to FIGS. 7A to 7C and 8. FIG. 7A is an equivalent circuit diagram of an MRAM cell. FIGS. 7B and 7C are sectional views of the cell. FIG. 8 is a block diagram of the MRAM.

As shown in FIG. 7A, the MRAM cell includes one TMR element and one cell transistor MC-TR. As shown in FIG. 7B, the cell transistor MC-TR includes source and drain regions 20a and 20b and gate electrode 21. The source and drain regions 20a and 20b are formed in a silicon substrate 1 so as to be spaced apart from each other. A gate insulating film (not shown) is formed on the silicon substrate between the source and drain region 20a and 20b. The gate electrode 21 is formed on the gate insulating film. The gate electrode 21 serves as a read word line RD-WL. The source region 20a is connected to ground potential via a metal interconnection layer 22. The drain region 20b is connected to one magnetic film 5 of the TMR element via metal interconnection layers 23 and 24. A metal interconnection layer 25 serving as a write word line WR-WL is formed in a dielectric interlayer 2 so as to extend in a direction perpendicular to a sub-sense line SSL and be electrically isolated from the TMR element. The direction of the spin of a magnetic film 6 is set to a predetermined direction in advance. In this state, the direction of the spin of the magnetic film 5 is made to become parallel or antiparallel to that of the magnetic film 6 to create two states, thereby writing "0"- or "1"-data.

FIG. 7C is a sectional view of an MRAM cell having a structure different from the one shown in FIG. 7B. As shown in FIG. 7C, in the structure shown in FIG. 7B, a magnetic film 26 is formed an insulating film 4, an insulating film 27 is formed on the magnetic film 26, and the magnetic film 6 is formed on the insulating film 27. The directions of the spins of the magnetic films 5 and 6 are set in advance to a predetermined direction so as to coincide with each other. In this state, the direction of the spin of the magnetic film 26 is made to become parallel or antiparallel to that of the magnetic films 5 and 6, thereby writing "0"- or "1"-data.

In this embodiment, the first embodiment is applied to a case where a cell array is formed by using MRAM cells each having a TMR element and cell transistor MC-TR.

As shown in FIG. 8, an MRAM 10 includes memory arrays MCA1 and MCA2, switch groups SGP1 to SGP8, row decoders ROWDEC1 to ROWDEC4, column decoders COLDEC1 and COLDEC2, and read/write section RD/WR_SEC.

Each of the memory arrays MCA1 and MCA2 has (6×6) MRAM cells MC arranged in the form of a matrix. The respective MRAM cells MC are arranged at the intersections of write word lines WR-WL1 to WR-WL6 and sub-sense lines SSL1 to SSL6 perpendicular to the write word lines WR-WL1 to WR-WL6. Obviously, the number of memory cells MC included in each of the memory arrays MCA1 and MCA2 is not limited to (6×6). This MRAM cell MC has the structure shown in FIGS. 7A and 7B or FIGS. 7A and 7C. The write word line WR-WL in FIG. 7A is connected to one of the write word lines WR-WL1 to WR-WL6 in FIG. 8, and the sub-sense line SSL in FIG. 7A is connected to one of the sub-sense lines SSL1 to SSL6 in FIG. 8. In addition, the read word lines RD-WL of the respective MRAM cells on each row are connected to one of the common read word lines RD-WL1 to RD-WL6.

The switch groups SGP1 and SGP2 respectively have six switching transistors S11 to S16 and six switching transistors S21 to S26. The gate and one of the source and drain of each of the switching transistors S11 to S16 are connected to the row decoder ROWDEC1, and the other of the source and drain of each switching transistor is connected to one end of each of the write word lines WR-WL1 to WR-WL6 in the memory array MCA1. The gate and one of the source and drain of each of the switching transistors S21 to S26 are connected to the row decoder ROWDEC2, and the other of the source and drain of each switching transistor is connected to the other end of each of the write word lines WR-WL1 to WR-WL6 in the memory array MCA1.

The switch groups SGP3 and SGP4 respectively have six switching transistors S31 to S36 and six switching transistors S41 to S46. The gate and one of the source and drain of each of the switching transistors S31 to S36 are connected to the column decoder COLDEC1, and the other of the source and drain of each switching transistor is connected to one end of each of the sub-sense lines SSL1 to SSL6 in the memory array MCA1. The gates of the switching transistors S41 to S46 are connected to the column decoder COLDEC1. One of the source and drain of each of these switching transistors is connected to a main sense line MSL, and the other of the source and drain of each switching transistor is connected to the other end of each of the sub-sense lines SSL1 to SSL6 in the memory array MCA1.

The switch groups SGP5 and SGP6 respectively have six switching transistors S51 to S56 and six switching transistors S61 to S66. The gate and one of the source and drain of each of the switching transistors S51 to S56 are connected to the row decoder ROWDEC3, and the other of the source and drain of each switching transistor is connected to one end of each of the write word lines WR-WL1 to WR-WL6 in the memory array MCA2. The gate and one of the source and drain of each of the switching transistors S61 to S66 are connected to the row decoder ROWDEC4, and the other of the source and drain of each switching transistor is connected to the other end of each of the write word lines WR-WL1 to WR-WL6 in the memory array MCA2.

The switch groups SGP7 and SGP8 respectively have six switching transistors S71 to S76 and six switching transistors S81 to S86. The gate and one of the source and drain of each of the switching transistors S71 to S76 are connected to the column decoder COLDEC2, and the other of the source and drain of each switching transistor is connected to one end of each of the sub-sense lines SSL1 to SSL6 in the memory array MCA2. The gates of the switching transistors S81 to S86 are connected to the column decoder COLDEC2. One of the source and drain of each of these switching transistors is connected to the main sense line MSL, and the other of the source and drain of each switching transistor is connected to the other end of each of the sub-sense lines SSL1 to SSL6 in the memory array MCA2.

The row decoders ROWDEC1 and ROWDEC2 control the switching transistors in the switch groups SGP1 and SGP2. In a write operation, a current is supplied to one of the write word lines WR-WL1 to WR-WL6 which is selected in the memory array MCA1. In a read operation, the row decoder ROWDEC1 selects one of the read word lines RD-WL1 to RD-WL6 in the memory array MCA1, and applies a voltage equal to or higher than a threshold for the cell transistor MC-TR to the selected read word line.

The row decoders ROWDEC3 and ROWDEC4 control the switching transistors in the switch groups SGP3 and SGP4. In a write operation, a current is supplied to one of the write word lines WR-WL1 to WR-WL6 which is selected in the memory array MCA2. In a read operation, the row decoder ROWDEC3 selects one of the read word lines RD-WL1 to RD-WL6 in the memory array MCA2, and applies a voltage equal to or higher than a threshold for the cell transistor MC-TR to the selected read word line.

The column decoder COLDEC1 controls the switching transistors included in the switch groups SGP3 and SGP4. The column decoder COLDEC2 controls the switching transistors included in the switch groups SGP7 and SGP8. Each column decoder determines the potentials of the sub-sense lines SSL1 to SSL6 and switches between connection and disconnection for the main sense line MSL.

As described above, the main sense line MSL, to which the 12 sub-sense line SSL1 to SSL6 and SSL1 to SSL6 are connected via the switch group SGP4 and SGP8, is connected to the read/write section RD/WR_SEC. The read/write section RD/WR_SEC includes a write switching transistor S200, read switching transistor S300, and sense circuit 12. The write switching transistor S200 sets the main sense line MSL at ground potential in a write operation. The sense circuit 12 is connected to the main sense line MSL via the read switching transistor S300. The gates of the write switching transistor S200 and read switching transistor S300 are respectively connected to a write control signal line WR_CNT and read control signal line RD_CNT to which a write control signal and read control signal are respectively input. The sense circuit 12 has an operational amplifier 13 and resistive element 14. The operational amplifier 13 has a noninverting input terminal connected to a power supply potential, an inverting input terminal connected to the main sense line MSL via the read switching transistor S300, and an output terminal. The resistive element 14 has one end connected to the noninverting input terminal of the operational amplifier 13, and the other end connected to the output terminal of the operational amplifier 13. In a read operation, the sense circuit 12 converts a read current Iread input from the main sense line MSL via the read switching transistor S300 into a voltage by using the resistive element 14, and outputs it as a read voltage Vout.

The operation of the MRAM having the above arrangement will be described next. A write operation will be described first by exemplifying a case wherein data is written in a memory cell MC66 placed at the intersection of the sub-sense line SSL6 and word line WL6 in the memory array MCA2.

First of all, the column decoder COLDEC2 turns on the switching transistor S86 in the switch group SGP8 to connect the sub-sense line SSL6 in the memory array MCA2 to the main sense line MSL. The column decoder COLDEC2 also turns on the switching transistor S76 in the switch group SGP7 to apply a write voltage to the sub-sense line SSL6. In addition, the write switching transistor S200 is turned on by supplying a write control signal to the write control signal line WR_CNT. With this operation, the write current Iwrite flows from the sub-sense line SSL6 to the main sense line MSL. Note that the switching transistors S81 to S85 in the switch group SGP8, the switching transistors S71 to S75 in the switch group SGP7, and all the switching transistors in the switch group SGP4 are set in the OFF state. The switching transistors in the switch group SGP3 may be set in either the ON state or the OFF state.

The row decoders ROWDEC3 and ROWDEC4 turn on the switching transistor S56 in the switch group SGP5 and the switching transistor S66 in the switch group SGP6. A current is then supplied from either the row decoder ROWDEC3 side or the row decoder ROWDEC4 side to the write word line WR-WL6. Depending on the direction of the current flowing through the write word line WR-WL6, "0"- or "1"-data is written in the memory cell MC66. Note that the switching transistors S51 to S55 in the switch group SGP5 and the switching transistors S61 to S65 in the switch group SGP6 are set in the OFF state. The switching transistors in the switch groups SGP1 and SGP2 may be set in either the ON state or the OFF state.

A read operation will be described next by exemplifying a case wherein data is read out from the memory cell MC66.

First of all, the column decoder COLDEC2 turns on the switching transistor S86 in the switch group SGP8 to connect the sub-sense line SSL6 in the memory array MCA2 to the main sense line MSL. The column decoder COLDEC2 also turns off the switching transistor S76 in the switch group SGP7. The remaining switching transistors S81 to S85 and all the switching transistors in the switch group SGP4, which are connected to the main sense line MSL are set in the OFF state. By setting the switching transistors S71 to S75 in the switch group SGP7 in the ON state, the unselected sub-sense lines SSL1 to SSL5 are set at ground potential. The switching transistors in the switch group SGP3 may be set in either the ON state or the OFF state.

In addition, the read switching transistor S300 is turned on by supplying a read control signal to the read control signal line RD_CNT so as to connect the sense circuit 12 to the main sense line MSL.

The row decoder ROWDEC3 then applies a voltage to the read word line RD-WL6 to turn on the cell transistor MC-TR in the memory cell MC66. In this case, the remaining read word lines RD-WL1 and RD-WL5 and all the write word lines WR-WL1 to WR-WL6 are set at ground potential or in the floating state.

Since the main sense line MSL is virtually set at the power supply potential, the read current Iread flows from the main sense line MSL to the memory cell MC66 via the sub-sense line SSL6. This read current Iread is converted into a voltage by the resistive element 14. The voltage is then output as the read voltage Vout from the output terminal of the operational amplifier 13.

As described above, according to the MRAM of the fourth embodiment of the present invention, the same effect as that described in the first embodiment can be obtained with an MRAM cell including a TMR element and cell transistor. Obviously, a memory cell including both a TMR element and a cell transistor can be applied to the second and third embodiments.

Figure 9A:
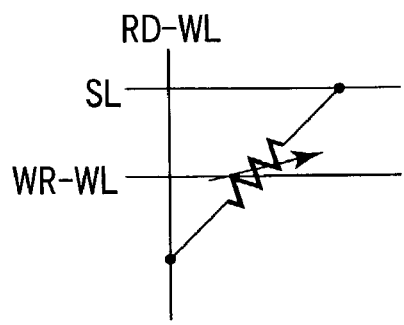
FIG. 9A is an equivalent circuit diagram of an MRAM cell according to the fifth embodiment of the present invention.
Figure 9B:
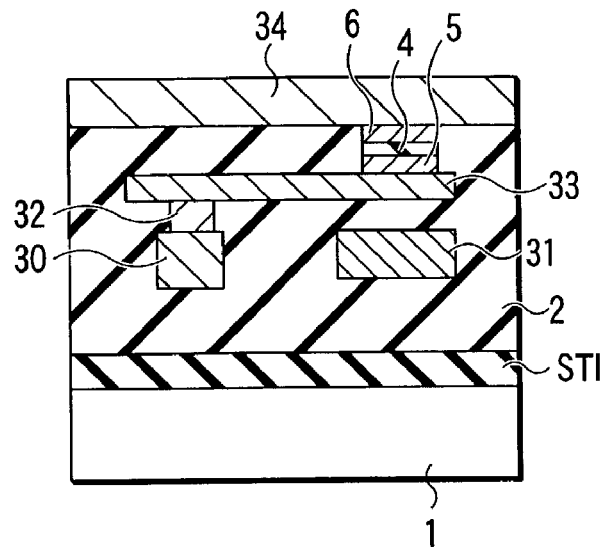
FIGS. 9B and 9C are sectional views of the MRAM cell in FIG. 9A.

A semiconductor memory device according to the fifth embodiment of the present invention will be described next with reference to FIGS. 9A and 9B. FIG. 9A is an equivalent circuit diagram of an MRAM cell. FIG. 9B is a sectional view of the cell.

As shown in FIGS. 9A and 9B, an MRAM cell is formed from only a TMR element. More specifically, a metal interconnection layer 30 serving as a sense line SL is formed in a dielectric interlayer 2 formed on a silicon substrate 1. A metal interconnection layer 31 serving as a write word line WR-WL is formed at the same level as that the sense line SL to be parallel to the sense line SL. A TMR element is formed in the dielectric interlayer 2 so as to be connected to the sense line SL via metal interconnection layers 32 and 33 and located adjacent to the write word line WR-WL. The TMR element has a magnetic film 5 formed on the metal interconnection layer 33, an insulating film 4 formed on the magnetic film 5, and a magnetic film 6 formed on the insulating film 4. A metal interconnection layer 34 serving as a read word line RD-WL is formed on the dielectric interlayer 2 to extend in a direction perpendicular to the sense line SL so as to be electrically connected to the magnetic film 6.

A write/read method for the above MRAM cell will be described next. In a write operation, currents are supplied to the write word line WR-WL and read word line RD-WL. The directions of the spins of the magnetic films 5 and 6 are made parallel or antiparallel by controlling the direction of the current flowing through the read word line RD-WL. With this operation, "0"- or "1"-data is written. In a data read operation, a voltage is applied to the read word line RD-WL. Data is read out from an MRAM cell by extracting the current flowing through the sense line SL.

The write word line WR-WL is newly added to the above MRAM cell. In a write operation, therefore, only the current supplied to the read word line RD-WL directly flows in the MRAM cell. This makes it possible to suppress an electrical stress imposed on the TMR element in a write operation, thus improving the reliability of the MRAM cell. Note that as the write word line WR-WL and sense line SL, metal interconnection layers at the same level are preferably used. In this case, the metal interconnection layers 30 and 31 can be patterned in the same step, and hence the manufacturing process can be simplified.

Figure 9C:
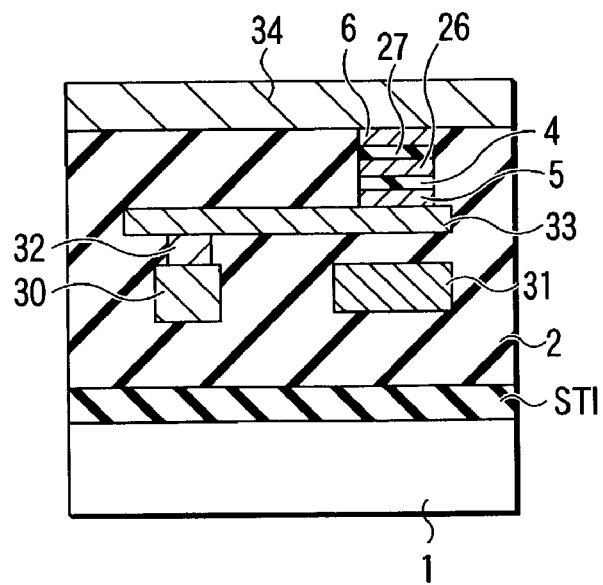

FIG. 9C is a sectional view of an MRAM cell having a structure different from the one shown in FIG. 9B. As shown in FIG. 9C, in the structure shown in FIG. 9B, a magnetic film 26 is formed on the insulating film 4, an insulating film 27 is formed on the magnetic film 26, and the magnetic film 6 is formed on the insulating film 27. The directions of the spins of the magnetic films 5 and 6 are set in advance to a predetermined direction so as to coincide with each other. A write/read method used for this structure is the same as that used for the structure shown in FIG. 9B except that the direction of the spin of the magnetic film 26 is controlled in a write operation. By making the direction of the spin of the magnetic film 26 parallel or antiparallel to that of the magnetic films 5 and 6, "0"- or "1"-data is written. The structure shown in FIG. 9C can obtain a higher MR ratio than the structure shown in FIG. 9B.

Figure 10:
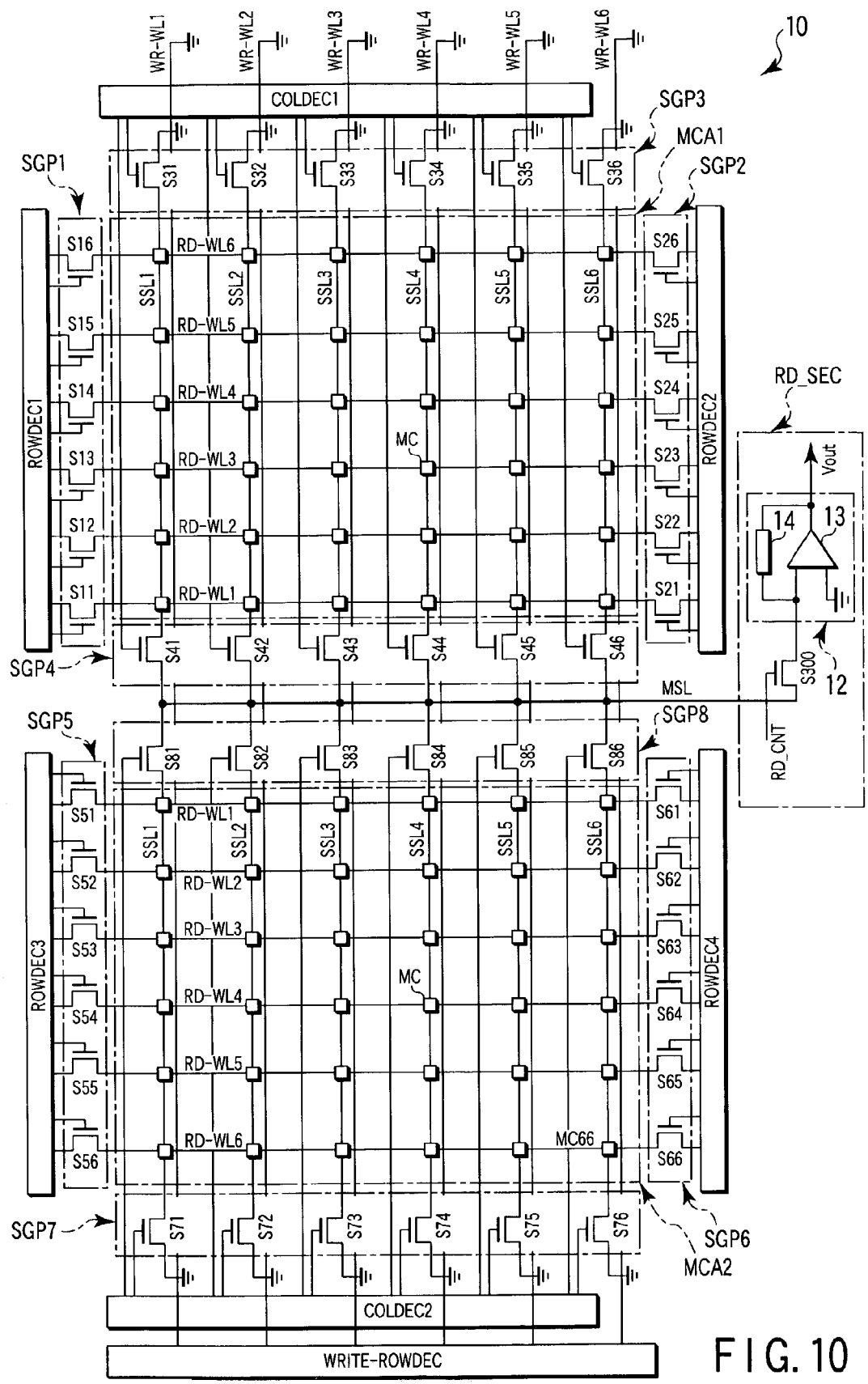
FIG. 10 is a block diagram showing an MRAM according to the sixth embodiment of the present invention.

A semiconductor memory device according to the sixth embodiment of the present invention will be described next with reference to FIG. 10. FIG. 10 is a block diagram of an MRAM. In this embodiment, the first embodiment is applied to a case wherein a cell array is formed by using MRAM cells according to the fifth embodiment.

As shown in FIG. 10, an MRAM 10 includes memory arrays MCA1 and MCA2, switch groups SGP1 to SGP8, row decoders ROWDEC1 to ROWDEC4, column decoders COLDEC1 and COLDEC2, read section RD_SEC, and write row decoder WRITE-ROWDEC.

Each of the memory arrays MCA1 and MCA2 has (6×6) MRAM cells MC arranged in the form of a matrix. The respective MRAM cells MC are arranged at the intersections of a plurality of read word lines RD-WL to RD-WL6 and sub-sense lines SSL1 to SS6 perpendicular to the read word lines RD-WL1 to RD-WL6. Obviously, the number of memory cells MC included in each of the memory array MCA1 and MCA2 is not limited to (6×6). This MRAM cell MC has the structure shown in FIGS. 9A and 9B or FIGS. 9A and 9C. A read word line RD-WL in FIG. 9A is connected to one of the read word lines RD-WL1 and RD-WL6 in FIG. 10, and a sense line SL in FIG. 9A is connected to one of the sub-sense lines SSL1 to SSL6 in FIG. 10. In addition, write word lines WR-WL for MRAM cells on each column are connected to one of common write word lines WR-WL1 to WR-WL6. Note that the write word lines WR-WL1 to WR-WL6 are commonly connected in the memory arrays MCA1 and MCA2. One end of each of write word lines WR-WL1 to WR-WL6 is connected to ground potential, and the other end is connected to the write row decoder WRITE-ROWDEC.

The switch groups SGP1 and SGP2 respectively have six switching transistors S11 to S16 and six switching transistors S21 to S26. The gate and one of the source and drain of each of the switching transistors S11 to S16 are connected to the row decoder ROWDEC1, and the other of the source and drain of each switching transistor is connected to one end of each of the read word lines RD-WL1 to RD-WL6 in the memory array MCA1. The gate and one of the source and drain of each of the switching transistors S21 to S26 are connected to the row decoder ROWDEC2, and the other of the source and drain of each switching transistor is connected to the other end of each of the read word lines RD-WL1 to RD-WL6 in the memory array MCA1.

The switch groups SGP3 and SGP4 respectively have six switching transistors S31 to S36 and six switching transistors S41 to S46. The gates of the switching transistors S31 to S36 are connected to the column decoder COLDEC1. One of the source and drain of each of these switching transistors is connected to ground potential, and the other of the source and drain of each switching transistor is connected to one end of each of the sub-sense lines SSL1 to SSL6 in the memory array MCA1. The gates of the switching transistors S41 to S46 are connected to the column decoder COLDEC1. One of the source and drain of each of these switching transistors is connected to a main sense line MSL, and the other of the source and drain of each switching transistor is connected to the other end of each of the sub-sense lines SSL1 to SSL6 in the memory array MCA1.

The switch groups SGP5 and SGP6 respectively have six switching transistors S51 to S56 and six switching transistors S61 to S66. The gate and one of the source and drain of each of the switching transistors S51 to S56 are connected to the row decoder ROWDEC3, and the other of the source and drain of each switching transistor is connected to one end of each of the read word lines RD-WL1 to RD-WL6 in the memory array MCA2. The gate and one of the source and drain of each of the switching transistors S61 to S66 are connected to the row decoder ROWDEC4, and the other of the source and drain of each switching transistor is connected to the other end of each of the read word lines RD-WL1 to RD-WL6 in the memory array MCA2.

The switch groups SGP7 and SGP8 respectively have six switching transistors S71 to S76 and six switching transistors S81 to S86. The gates of the switching transistors S71 to S76 are connected to the column decoder COLDEC2. One of the source and drain of each of these switching transistors is connected to ground potential, and the other of the source and drain of each switching transistor is connected to one end of each of the sub-sense lines SSL1 to SSL6 in the memory array MCA2. The gates of the switching transistors S81 to S86 are connected to the column decoder COLDEC2. One of the source and drain of each of these switching transistors is connected to a main sense line MSL, and the other of the source and drain of each switching transistor is connected to the other end of each of the sub-sense lines SSL1 to SSL6 in the memory array MCA2.

The row decoders ROWDEC1 to ROWDEC4 respectively control the switching transistors included in the switch groups SGP1, SGP2, SGP5, and SGP6, and apply predetermined potentials to the read word lines RD-WL1 to RD-WL6.

The column decoder COLDEC1 controls the switching transistors included in the switch groups SGP3 and SGP4, and the column decoder COLDEC2 controls the switching transistors included in the switch groups SGP7 and SGP8. Each column decoder determines the potentials of the sub-sense lines SSL1 to SSL6 and switches between connection and disconnection for the main sense line MSL.

The write row decoder WRITE-ROWDEC is used in a write operation to supply a write current to one of the write word lines WR-WL1 to WR-WL6.

The main sense line MSL, to which the 12 sub-sense lines SSL1 to SSL6 and SSL1 to SSL6 are connected via the switch groups SGP4 and SGP8, is connected to the read section RD_SEC. The read section RD_SEC includes a read switching transistor S300 and sense circuit 12. The sense circuit 12 is connected to the main sense line MSL via the read switching transistor S300. The gate of the read switching transistor S300 is connected to a read control signal line RD_CNT to which a read control signal is input. The sense circuit 12 is the same as the one in the first embodiment, and hence a description thereof will be omitted.

The operation of the MRAM having the above arrangement will be described next. Write operation will be described first by exemplifying a case wherein data is written in a memory cell MC66 placed at the intersection of the sub-sense line SSL6 and the word line WL6 in the memory array MCA2.

First of all, the column decoder COLDEC2 turns off all the switching transistors in the switch group SGP7 and SGP8. Note that all the switching transistors in the switch group SGP4 are set in the OFF state, and the switching transistors in the switch group SGP3 may be set in either the ON state or the OFF state.

The write row decoder WRITE-ROWDEC then supplies a current to the write word line WL-WL6.

The row decoders ROWDEC3 and ROWDEC4 turn on the switching transistor S56 in the switch group SGP5 and the switching transistor S66 in the switch group SGP6. The row decoder ROWDEC3 or ROWDEC4 supplies a current to the read word line RD-WL6. A magnetic field is formed around the read word line RD-WL6 by the current flowing through the read word line RD-WL6. Depending on the direction of the current flowing through the read word line RD-WL6, "0"- or "1"-data is written in the MRAM cell MC66. Note that the switching transistors S81 to S85 in the switch group SGP8 and the switching transistors S61 to S65 in the switch group SGP6 are set in the OFF state. The switching transistors in the switch groups SGP1 and SGP2 may be set in either the ON state or the OFF state.

Read operation will be described next by exemplifying a case wherein data is read out from the memory cell MC66.

First of all, the row decoder ROWDEC3 turns on the switching transistor S56 in the switch group SGP5, and the row decoder ROWDEC4 turns off the switching transistor S66 in the switch group SGP6. The voltage Vread is then applied to the read word line RD-WL6 in the memory array MCA2. In this case, all the remaining read word lines RD-WL1 to RD-WL5 are set at ground potential or in the floating state.

The column decoder COLDEC2 then turns on the switching transistor S86 in the switch group SGP8 to connect the sub-sense line SSL6 in the memory array MCA2 to the main sense line MSL. The column decoder COLDEC2 also turns off the switching transistor S76 in the switch group SGP7. The remaining switching transistors S81 to S85 and all the switching transistors in the switch group SGP4, which are connected to the main sense line MSL are set in the OFF state. In addition, the unselected sub-sense lines SSL1 to SSL5 are set at ground potential by setting the switching transistors S71 to S75 in the switch group SGP7 in the ON state. The switching transistors in the switch group SGP3 may be set in either the ON state or the OFF state.

In addition, a read control signal is supplied to the read control signal line RD_CNT to turn on the read switching transistor S300, thereby connecting the sense circuit 12 to the main sense line MSL.

As a consequence, upon application of a voltage Vread, a read current Iread flows from the memory cell MC66 to the main sense line MSL via the sub-sense line SSL6. The read current Iread flows into the sense circuit 12. The read current Iread is then converted into a voltage by a resistive element 14. This voltage is output as a read voltage Vout from the output terminal of an operational amplifier 13.

As described above, according to the MRAM of the sixth embodiment of the present invention, both the effects described in the first and fifth embodiments can be obtained.

Figure 11A:
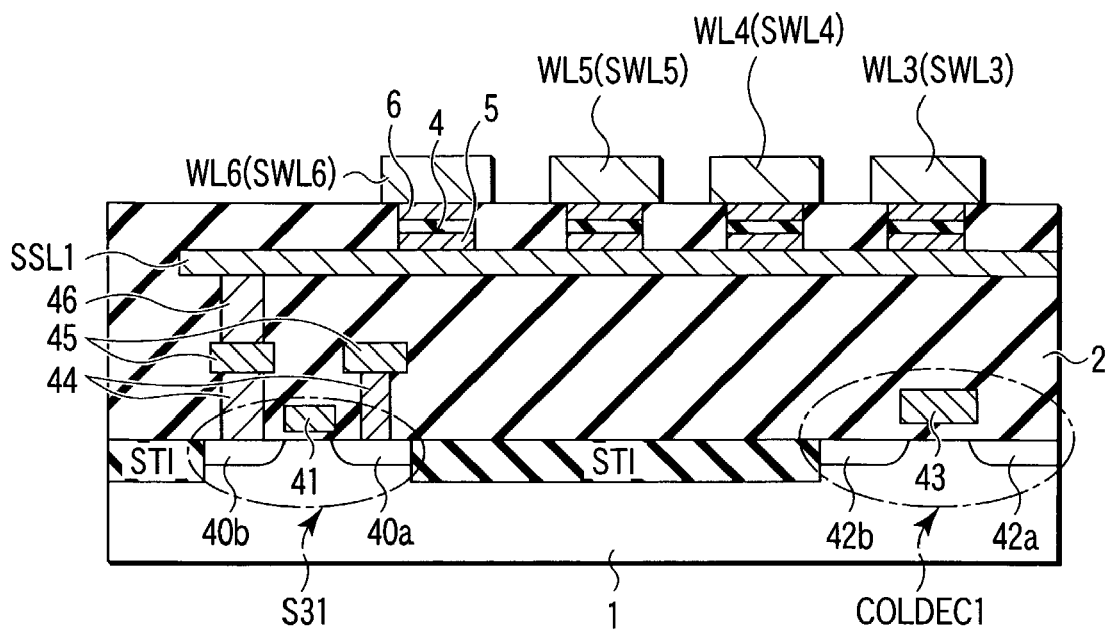
FIG. 11A is a sectional view of an MRAM according to the seventh embodiment of the present invention.

A semiconductor memory device according to the seventh embodiment of the present invention will be described next with reference to FIG. 11A. FIG. 11A is a view showing a sectional structure of a region of an MRAM, and more specifically, a sectional view taken along the sub-sense line SSL1 in one of regions AA1 to AA3 in FIGS. 2, 5, and 6.

As shown in FIG. 11A, a switching transistor S31 and a MOS transistor serving as part of a column decoder COLDEC1 are formed in the element region of a silicon substrate 1. The switching transistor S31 has impurity diffusion layers 40a and 40b and gate electrode 41. The impurity diffusion layers 40a and 40b are formed in the silicon substrate 1 so as to be spaced apart from each other, and serve as source and drain regions. The gate electrode 41 is formed on the silicon substrate 1 with a gate insulating film (not shown) interposed therebetween. The MOS transistor serving as part of the column decoder COLDEC1 also has impurity diffusion layers 42a and 42b formed in the silicon substrate 1 so as to be spaced apart from each other and serve as source and drain regions, and a gate electrode 43 formed on the silicon substrate 1 with a gate insulating film (not shown) interposed therebetween. A dielectric interlayer 2 is formed on the silicon substrate 1 so as to cover these transistors. One of the source and drain regions (40a) of the switching transistor S31 is connected to ground potential via metal interconnection layers 44 and 45 formed in the dielectric interlayer 2. The sub-sense line SSL1 is formed in the dielectric interlayer 2 so as to extend over the column decoder COLDEC1, and is electrically connected to the other of the source and drain regions (40b) of the switching transistor S31. A plurality of MRAM cells each having an insulating film 4 sandwiched between magnetic films 5 and 6 are formed on the sub-sense line SSL1. Word lines WL6 to WL3 (or sub-word lines SWL6 to SWL3) are formed on each MRAM cell.

In the above structure, a switching transistor and column decoder are formed in an empty region below an MRAM cell. This makes it possible to reduce the area occupied by the MRAM and reduce the chip size.

Figure 11B:
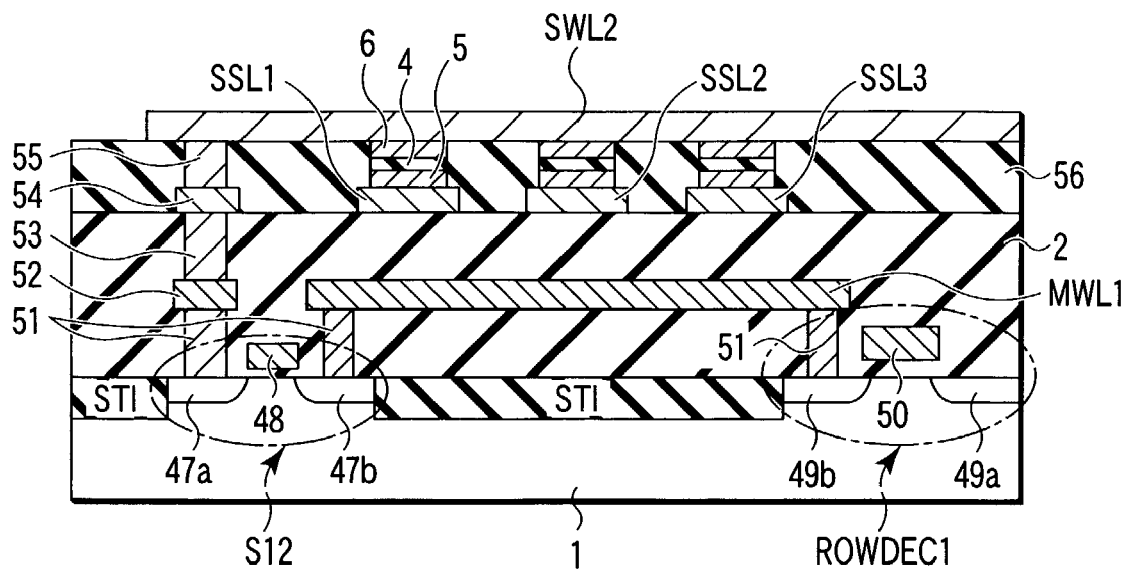
FIG. 11B is a sectional view of a modification of the MRAM according to the seventh embodiment of the present invention.

FIG. 11B is a view showing a sectional structure of a region of an MRAM according to a modification of this embodiment, and more specifically, a sectional view taken along a sub-word line SWL2 in one of regions AA4 and AA5 in FIGS. 5 and 6.

As shown in FIG. 11B, a switching transistor S12 and a MOS transistor serving as part of a row decoder ROWDEC1 are formed in the element region of the silicon substrate 1. The switching transistor S12 has impurity diffusion layers 47a and 47b and gate electrode 48. The impurity diffusion layers 47a and 47b are formed in the silicon substrate 1 so as to be spaced apart from each other, and serve as source and drain regions. The gate electrode 48 is formed on the silicon substrate 1 with a gate insulating film (not shown) interposed therebetween. The MOS transistor serving as part of the row decoder ROWDEC1 also has impurity diffusion layers 49a and 49b formed in the silicon substrate 1 so as to be spaced apart from each other and serve as source and drain regions, and a gate electrode 50 formed on the silicon substrate 1 with a gate insulating film (not shown) interposed therebetween. The dielectric interlayer 2 is formed on the silicon substrate 1 so as to cover these transistors. A main word line MWL1 is formed in the dielectric interlayer 2. One of the source and drain (47b) of the switching transistor S12 and one of the source and drain regions (49b) of the MOS transistor serving as part of the row decoder ROWDEC 1 are connected to a main word line MWL1 via a metal interconnection layer 51. Sub-sense lines SSL1 to SSL3 are formed on the dielectric interlayer 2. MRAM cells each having the insulating film 4 sandwiched between the magnetic films 5 and 6 are formed on the sub-sense lines SSL1 to SSL3. A dielectric interlayer 56 is further formed on the dielectric interlayer 2. The sub-word line SWL2 common to the respective MRAM cells is formed on the dielectric interlayer 56. The sub-word line SWL2 is connected to the other (47a) of the source and drain regions of the switching transistor S12 via metal interconnection layers 51 to 55 formed in the dielectric interlayers 2 and 56.

According to the above structure, a switching transistor, row decoder, and main word line are formed in an empty region below an MRAM cell. In other words, an MRAM cell and its peripheral circuit are so arranged as to overlap in a direction perpendicular to the surface of the silicon substrate. This makes it possible to reduce the area occupied by the MRAM and reduce the chip size. Obviously, the write row decoder WRITE-ROWDEC or main sense line MSL may be formed at a level different from that of an MRAM cell, and the same effect as that described above can be obtained. In addition, the read/write section RD/WR_SEC and other peripheral circuits may be formed in a region below each MRAM cell as well as a row decoder and column decoder. Even if a metal interconnection layers serving as a main word line, main sense line, and the like are formed above each MRAM cell instead of below, the area reducing effect can be obtained.

As described above, according to the MRAMs of the first to seventh embodiments of the present invention, the memory cell array is divided into arrays by arranging the sense lines in the hierarchical bit line architecture including a main sense line and sub-sense lines. According to the MRAMs of the second to seventh embodiments of the present invention, the word lines are also arranged in the hierarchical word line architecture including main word lines and sub-word lines to divide the memory cell array into arrays. With this structure, in a read operation, parasitic impedances existing in parallel with a selected memory cell on a sense line are reduced. This makes it possible to efficiently supply a read current from the selected cell to the sense circuit, thus suppressing an increase in current consumption. In addition, even if the number of memory cells increases, high data read precision can be maintained. Hence, the integration degree of an MRAM can be further increased.

According to the MRAM of the third embodiment, one of switch groups connected to sub-word lines is connected to ground potential. These switch groups are arranged adjacent to each other to reduce the number of interconnections and the occupied area.

According to the MRAMs of the fifth and sixth embodiments, a MRAM cell formed by only a TMR element additionally has a write word line that is not directly connected to the TMR element. This makes it possible to reduce the stress imposed on the TMR element in a write operation and improve the reliability of the MRAM.

According to the MRAM of the seventh embodiment, each switching transistor and the peripheral circuit such as a decoder are arranged in an empty region below each MRAM cell. In addition, the sub-word lines, main word lines, sub-sense lines, and main sense line are formed by using different interconnection layers. As a consequence, the area occupied by the MRAM can be reduced, and the chip size can be reduced.

Note that the embodiments of the present invention can be generally and widely applied to semiconductor devices having each cell placed at the intersection of two interconnections as well as an MRAM. According to the first to seventh embodiments, each decoder and each switch group are handled as discrete components. However, each switch group may be incorporated in each decoder. In addition, the respective embodiments may be used in combination.

Figure 12A:
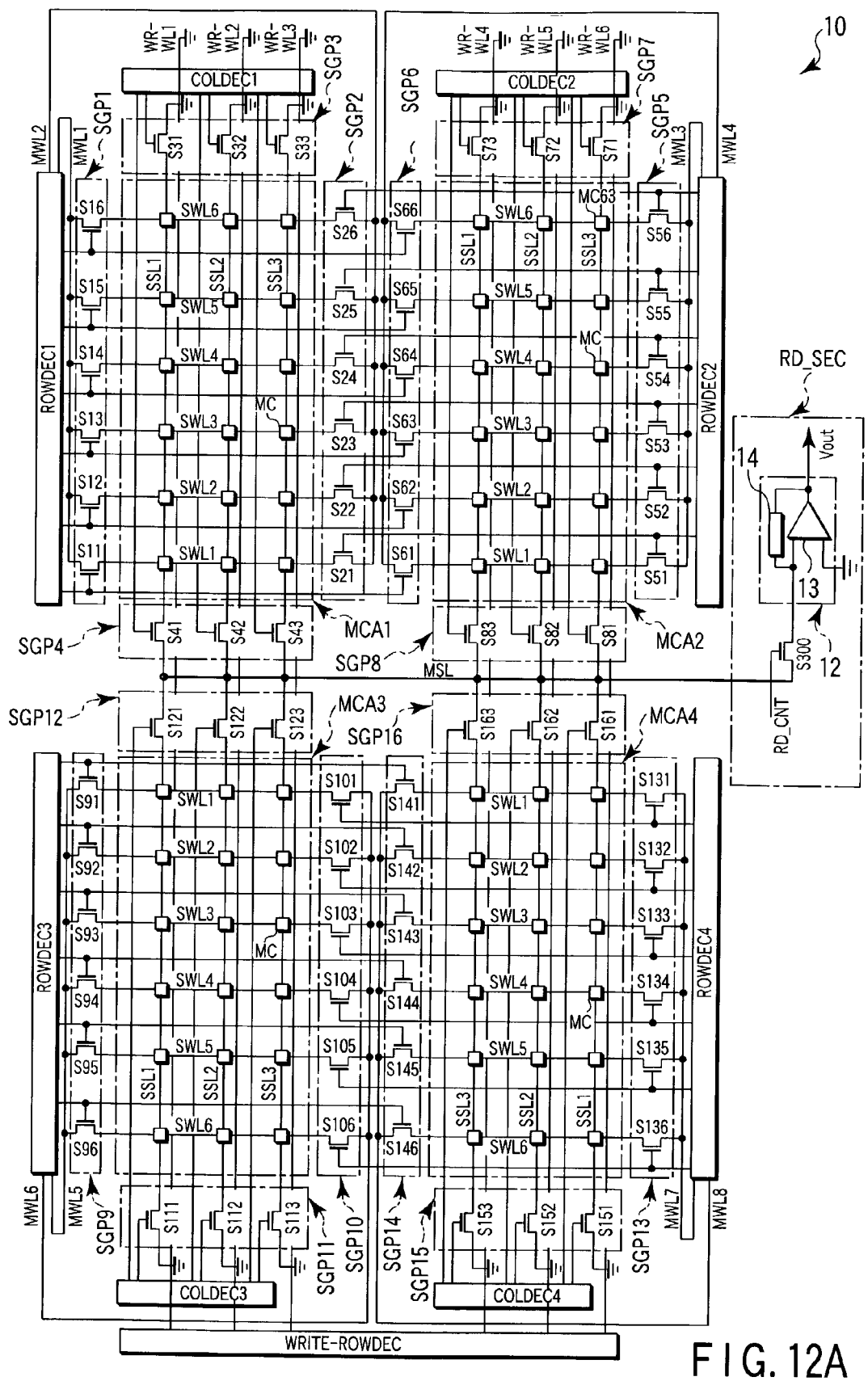
FIGS. 12A and 12B are sectional views of MRAMs according to the first and second modifications of the sixth embodiment of the present invention.

FIG. 12A is a block diagram showing an MRAM as a combination of the second and sixth embodiments. As shown in FIG. 12A, the hierarchical word line architecture is used in the sixth embodiment to divide a memory cell array into four arrays. The sub-word lines SWL1 to SWL6 in the respective memory arrays MCA1 to MCA4 are used as read word lines. With this arrangement, both the effects described in the second and sixth embodiments can be obtained.

Figure 12B:
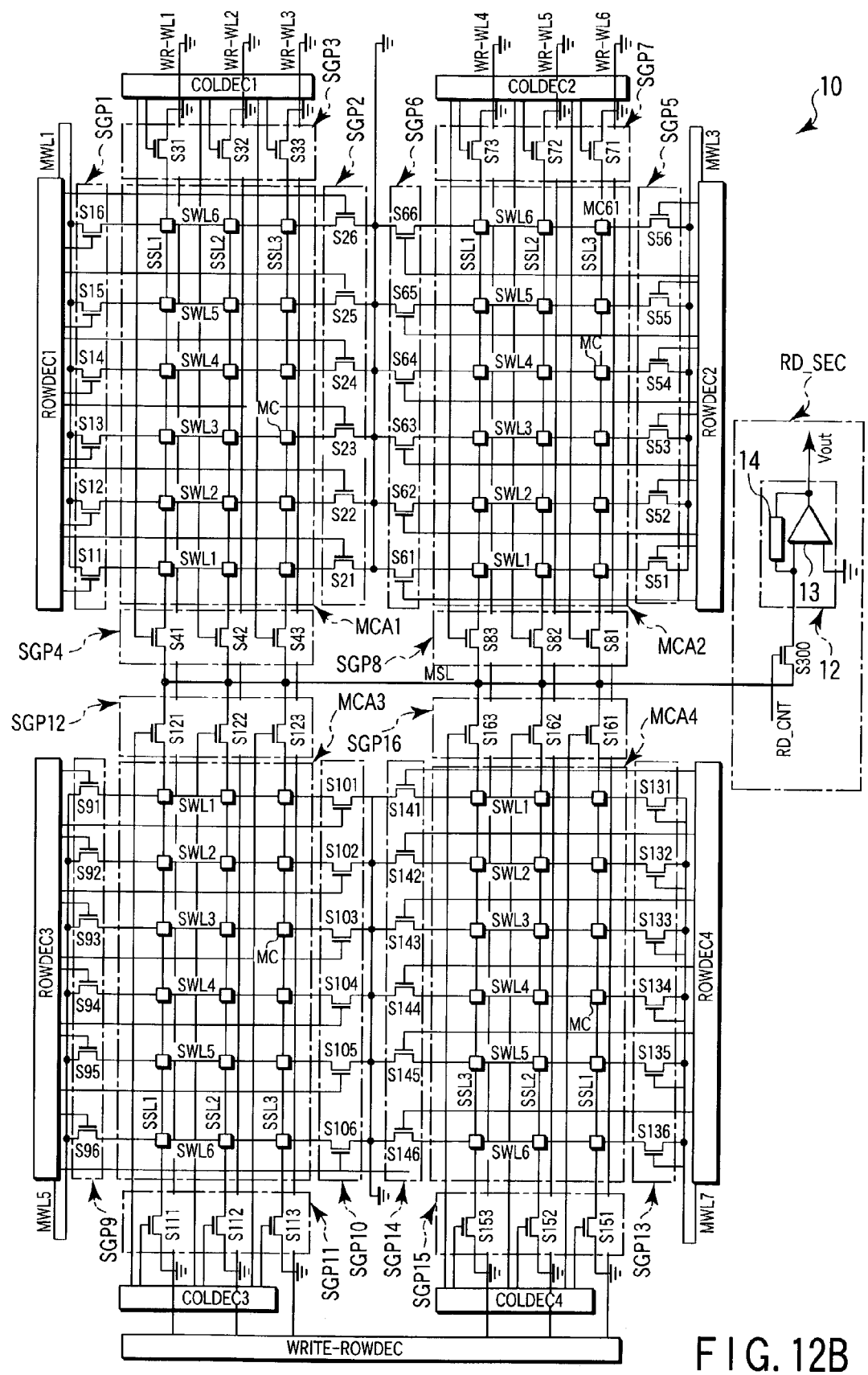

FIG. 12B is a block diagram showing an MRAM as a combination of the third and sixth embodiments. As shown in FIG. 12B, in the MRAM shown in FIG. 12A, one of the switch groups connected to the sub-word lines SWL1 to SWL6 is connected to ground potential, and these switch groups are arranged adjacent to each other. This makes it possible to obtain both the effects described in the third and sixth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array in which memory cells, each including a magnetoresistive element having first and second magnetic layers and a first insulating layer formed between the first and second magnetic layers, are arranged in the form of a matrix;
    word lines connected to the first magnetic layers of the memory cells on each row of said memory cell array;
    sub-sense lines connected to the second magnetic layers of the memory cells on each column of said memory cell array;
    a main sense line connected to each of said sub-sense lines;
    a row decoder which selects a word line of said memory cell array;
    a column decoder which selects a sub-sense line of said memory cell array;
    a first switch element which connects said sub-sense line selected by said column decoder to said main sense line;
    a read circuit which reads out data from the memory cell selected by said row decoder and column decoder via said main sense line; and
    a write circuit which writes data in the memory cell selected by said row decoder and column decoder via said main sense line.

2. The device according to claim 1, wherein
    said first switch element includes a first MOS transistor formed on a semiconductor substrate,
    said memory cell array is formed on a dielectric interlayer which is formed on the semiconductor substrate so as to cover said first MOS transistor, and
    at least part of said memory cell array overlaps said first MOS transistor in a direction perpendicular to the semiconductor substrate.

3. The device according to claim 2, wherein
    said row decoder and column decoder respectively include second and third MOS transistors formed on the semiconductor substrate and covered by the dielectric interlayer, and
    at least part of said memory cell array overlaps at least one of said second and third MOS transistors in a direction perpendicular to the surface of the semiconductor substrate.

4. The device according to claim 1, wherein said magnetoresistive element further comprises:
    a third magnetic layer formed between the first insulating layer and the second magnetic layer; and
    a second insulating layer formed between the third magnetic layer and the second magnetic layer.

5. The device according to claim 1, further comprising a second switch element which connects said sub-sense line selected by said column decoder to a first potential node.

6. The device according to claim 1, wherein said write circuit comprises:
    a current source which supplies a write current to said main sense line when data is written in the memory cell; and
    a third switch element which connects said current source to said main sense line when data is written in the memory cell, and disconnects said current source from said main sense line when data is read out from the memory cell.

7. The device according to claim 1, wherein said read circuit comprises:
    a sense circuit which converts a read current flowing through said main sense line into a voltage when data is read out from the memory cell; and
    a fourth switch element which connects said sense circuit to said main sense line when data is read out from the memory cell, and disconnects said sense circuit from said main sense line when data is written in the memory cell.

8. The device according to claim 7, wherein said sense circuit comprises:
    an operational amplifier having a first input terminal connected to a second potential node, a second input terminal connected to said main sense line via said fourth switch element, and an output terminal; and
    a resistive element having one end connected to the second input terminal and another end connected to the output terminal of said operational amplifier.

9. The device according to claim 8, wherein said resistive element has substantially the same structure as that of said magnetoresistive element.

10. A semiconductor memory device comprising:
    a memory cell array in which memory cells, each including a magnetoresistive element having first and second magnetic layers and a first insulating layer formed between the first and second magnetic layers, are arranged in the form of a matrix;

sub-word lines connected to the first magnetic layers of the memory cells on each row of said memory cell array;

sub-sense lines connected to the second magnetic layers of the memory cells on each column of said memory cell array;

a main word line connected to each of said sub-word lines;

a main sense line connected to each of said sub-sense lines;

a row decoder which selects a sub-word line of said memory cell array and supplies one of a current and voltage to said main word line;

a column decoder which selects a sub-sense line of said memory cell array;

a first switch element which connects said sub-word line selected by said row decoder to said main word line;

a second switch element which connects said sub-sense line selected by said column decoder to said main sense line;

a read circuit which reads out data from the memory cell selected by said row decoder and column decoder via said main sense line; and a write circuit which writes data in the memory cell selected by said row decoder and column decoder via said main sense line.

11. The device according to claim 10, further comprising a third switch element which connects said sub-sense line selected by said row decoder to a first potential node.

12. The device according to claim 11, wherein the first potential node to which said sub-word line is connected by said third switch element is a common node shared between two adjacent memory cell arrays.

13. The device according to claim 10, wherein
said first and second switch elements respectively include first and second MOS transistors formed on a semiconductor substrate,
said memory cell array is formed on a dielectric interlayer which is formed on the semiconductor substrate so as to cover said first and second MOS transistors, and
at least part of said memory cell array overlaps at least one of said first and second MOS transistors in a direction perpendicular to the semiconductor substrate.

14. The device according to claim 13, wherein
said row decoder and column decoder respectively include third and fourth MOS transistors formed on the semiconductor substrate and covered by the dielectric interlayer, and
at least part of said memory cell array overlaps at least one of said third and fourth MOS transistors in a direction perpendicular to the surface of the semiconductor substrate.

15. The device according to claim 10, wherein said magnetoresistive element further comprises:
a third magnetic layer formed between the first insulating layer and the second magnetic layer; and
a second insulating layer formed between the third magnetic layer and the second magnetic layer.

16. The device according to claim 10, further comprising a fourth switch element which connects said sub-sense line selected by said column decoder to a second potential node.

17. The device according to claim 10, wherein said write circuit comprises:

a current source which supplies a write current to said main sense line when data is written in the memory cell; and a fifth switch element which connects said current source to said main sense line when data is written in the memory cell, and disconnects said current source from said main sense line when data is read out from the memory cell.

18. The device according to claim 10, wherein said read circuit comprises:

a sense circuit which converts a read current flowing through said main sense line into a voltage when data is read out from the memory cell; and a sixth switch element which connects said sense circuit to said main sense line when data is read out from the memory cell, and disconnects said sense circuit from said main sense line when data is written in the memory cell.

19. The device according to claim 18, wherein said sense circuit comprises:

an operational amplifier having a first input terminal connected to a third potential node, a second input terminal connected to said main sense line via said sixth switch element, and an output terminal; and a resistive element having one end connected to the second input terminal and another end connected to the output terminal of said operational amplifier.

20. The device according to claim 19, wherein said resistive element has substantially the same structure as that of said magnetoresistive element.

21. A semiconductor memory device comprising:

a memory cell array in which memory cells, each including a magnetoresistive element having first and second magnetic layers and a first insulating layer formed between the first and second magnetic layers, a first word line electrically isolated from the magnetoresistive element and placed adjacent to the first magnetic layer, a second word line connected to said second magnetic layer and extending in a direction perpendicular to the first word line, and a sense line connected to the first magnetic layer, are arranged in the form of a matrix;

write word lines connected to the first word lines on each row of said memory cell array;

read/write word lines connected to the second word lines on each row of said memory cell array;

sub-sense lines connected to the sense lines on each column of said memory cell array;

a main sense line connected to each of said sub-sense lines;

a row decoder which selects a read/write word line of said memory cell array;

a write row decoder which selects a write word line and supplies current corresponding to a write data to the write word line when data is written in the memory cell;

a column decoder which selects a sub-sense line of said memory cell array;

a first switch element which connects said sub-sense line selected by said column decoder to said main sense line; and a read circuit which reads out data from the memory cell selected by said row decoder and column decoder via said main sense line.

22. The device according to claim 21, wherein
said first switch element includes a first MOS transistor formed on a semiconductor substrate, said memory cell array is formed on a dielectric interlayer which is formed on the semiconductor substrate so as to cover said first MOS transistor, and at least part of said memory cell array overlaps said first MOS transistor in a direction perpendicular to a surface of the semiconductor substrate.

23. The device according to claim 22, wherein said row decoder and column decoder respectively include third and fourth MOS transistors formed on the semiconductor substrate and covered by the dielectric interlayer, and at least part of said memory cell array overlaps at least one of said third and fourth MOS transistors in a direction perpendicular to the surface of the semiconductor substrate.

24. The device according to claim 21, wherein the first word line extends parallel to the sense line and is formed by a metal interconnection layer at the same level as that of the sense line.

25. The device according to claim 21, wherein a potential of the sense line is set in a floating state, and current is supplied to the first and second word lines, thereby data is written in the magnetoresistive element, and a voltage is applied to the second word line to supply a current to the sense line, thereby reading out data from the magnetoresistive element.

26. The device according to claim 21, wherein said magnetoresistive element further comprises:

a third magnetic layer formed between the first insulating layer and the second magnetic layer; and a second insulating layer formed between the third magnetic layer and the second magnetic layer.

27. The device according to claim 21, further comprising a second switch element which connects said sub-sense line selected by said column decoder to a first potential node.

28. The device according to claim 21, wherein said read circuit comprises:

a sense circuit which converts a read current flowing through said main sense line into a voltage when data is read out from the memory cell; and a third switch element which connects said sense circuit to said main sense line when data is read out from the memory cell, and disconnects said sense circuit from said main sense line when data is written in the memory cell.

29. The device according to claim 28, wherein said sense circuit comprises:

an operational amplifier having a first input terminal connected to a second potential node, a second input terminal connected to said main sense line via said third switch element, and an output terminal; and a resistive element having one end connected to the second input terminal and another end connected to the output terminal of said operational amplifier.

30. The device according to claim 29, wherein said resistive element has substantially the same structure as that of said magnetoresistive element.

31. A semiconductor memory device comprising:

a memory cell array in which memory cells, each including a magnetoresistive element having first and second magnetic layers and a first insulating layer formed between the first and second magnetic layers, a first word line electrically isolated from the magnetoresistive element and placed adjacent to the first magnetic layer, a second word line connected to said second magnetic layer and extending in a direction perpendicular to the first word line, and a sense line connected to the first magnetic layer, are arranged in the form of a matrix;

write word lines connected to the first word lines on each row of said memory cell array;

read/write sub-word lines connected to the second word lines on each row of said memory cell array;

sub-sense lines connected to the sense lines on each column of said memory cell array;

a read/write main word line connected to each of said read/write sub-word lines;

a main sense line connected to each of said sub-sense lines;

a row decoder which selects a read/write sub-word line of said memory cell array and supplies one of a current and voltage to said read/write main word line;

a write row decoder which selects a write word line and supplies a current corresponding to a write data to the write word line when data is written in the memory cell;

a column decoder which selects a sub-sense line of said memory cell array;

a first switch element which connects said read/write sub-word line selected by said row decoder to said main word line;

a second switch element which connects said sub-sense line selected by said column decoder to said main sense line; and a read circuit which reads out data from the memory cell selected by said row decoder and column decoder via said main sense line.

32. The device according to claim 31, further comprising a third switch element which connects said read/write sub-word line selected by said row decoder to a first potential node.

33. The device according to claim 32, wherein the first potential node to which said read/write sub-word line is connected by said third switch element is a common node shared between two adjacent memory cell arrays.

34. The device according to claim 31, wherein said first and second switch elements respectively include first and second MOS transistors formed on a semiconductor substrate, said memory cell array is formed on a dielectric interlayer which is formed on the semiconductor substrate so as to cover said first and second MOS transistors, and at least part of said memory cell array overlaps at least one of said first and second MOS transistors in a direction perpendicular to a surface of the semiconductor substrate.

35. The device according to claim 34, wherein said row decoder and column decoder respectively include third and fourth MOS transistors formed on the semiconductor substrate and covered by the dielectric interlayer, and at least part of said memory cell array overlaps at least one of said third and fourth MOS transistors in a direction perpendicular to the surface of the semiconductor substrate.

36. The device according to claim 31, wherein the first word line extends parallel to the sense line and is formed by a metal interconnection layer at the same level as that of the sense line.

37. The device according to claim 31, wherein a potential of the sense line is set in a floating state, and current is supplied to the first and second word lines, thereby data is written in the magnetoresistive element, and a voltage is applied to the second word line to supply a current to the sense line, thereby reading out data from the magnetoresistive element.

38. The device according to claim 31, wherein said magnetoresistive element further comprises:
- a third magnetic layer formed between the first insulating layer and the second magnetic layer; and
- a second insulating layer formed between the third magnetic layer and the second magnetic layer.

39. The device according to claim 31, further comprising a fourth switch element which connects said sub-sense line selected by said column decoder to a second potential node.

40. The device according to claim 31, wherein said read circuit comprises:
- a sense circuit which converts a read current flowing through said main sense line into a voltage when data is read out from the memory cell; and
- a fifth switch element which connects said sense circuit to said main sense line when data is read out from the memory cell, and disconnects said sense circuit from said main sense line when data is written in the memory cell.

41. The device according to claim 40, wherein said sense circuit comprises:
- an operational amplifier having a first input terminal connected to a third potential node, a second input terminal connected to said main sense line via said fifth switch element, and an output terminal; and
- a resistive element having one end connected to the second input terminal and another end connected to the output terminal of said operational amplifier.

42. The device according to claim 41, wherein said resistive element has substantially the same structure as that of said magnetoresistive element.

* * * * *